(12) United States Patent
Maruyama

(10) Patent No.: US 8,632,945 B2
(45) Date of Patent: Jan. 21, 2014

(54) RADIATION-SENSITIVE RESIN COMPOSITION, MONOMER, POLYMER, AND PRODUCTION METHOD OF RADIATION-SENSITIVE RESIN COMPOSITION

(75) Inventor: Ken Maruyama, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/479,268

(22) Filed: May 24, 2012

(65) Prior Publication Data

US 2012/0237876 A1 Sep. 20, 2012

Related U.S. Application Data

(63) Continuation of application No. PCT/JP2010/071398, filed on Nov. 30, 2010.

(30) Foreign Application Priority Data

| Dec. 8, 2009 | (JP) | ................................ | 2009-278985 |
| Mar. 11, 2010 | (JP) | ................................ | 2010-055039 |
| Jun. 7, 2010 | (JP) | ................................ | 2010-130463 |

(51) Int. Cl.
C07C 309/04 (2006.01)
C08F 228/00 (2006.01)
G03F 7/004 (2006.01)
G03F 7/028 (2006.01)

(52) U.S. Cl.
USPC ........ 430/270.1; 430/921; 526/286; 526/287; 562/30

(58) Field of Classification Search
USPC ............. 430/270.1, 906, 907, 910, 921, 922, 430/925; 526/286, 287; 562/30
See application file for complete search history.

(56) References Cited

U.S. PATENT DOCUMENTS

| 5,561,194 | A | 10/1996 | Cornett et al. | |
| 8,062,828 | B2 * | 11/2011 | Ohsawa et al. | 430/270.1 |
| 2003/0099900 | A1 | 5/2003 | Yamada et al. | |
| 2003/0207200 | A1 | 11/2003 | Barclay et al. | |
| 2010/0040977 | A1 * | 2/2010 | Nagai et al. | 430/285.1 |
| 2010/0233617 | A1 * | 9/2010 | Wada | 430/270.1 |
| 2010/0248149 | A1 * | 9/2010 | Tsuchimura et al. | 430/296 |
| 2010/0255420 | A1 * | 10/2010 | Sakakibara et al. | 430/285.1 |

FOREIGN PATENT DOCUMENTS

| JP | 2001-166474 | 6/2001 | |
| JP | 2001-166478 | 6/2001 | |
| JP | 2001-194792 | 7/2001 | |
| JP | 2003-107708 | 4/2003 | |
| WO | WO 2008/056796 | * | 5/2008 |
| WO | WO 2009/038148 | * | 3/2009 |
| WO | WO 2009/057484 | * | 5/2009 |

OTHER PUBLICATIONS

International Search Report for corresponding International Application No. PCT/JP2010/071398, Jan. 11, 2011.
Written Opinion for corresponding International Application No. PCT/JP2010/071398, Jan. 11, 2011.

* cited by examiner

*Primary Examiner* — Anca Eoff
(74) *Attorney, Agent, or Firm* — Ditthavong Mori & Steiner, P.C.

(57) ABSTRACT

A radiation-sensitive resin composition includes a solvent and a polymer. The polymer includes a repeating unit represented by a formula (I), a repeating unit represented by a formula (II), or a both thereof. Each of $R_1$ to $R_3$ independently represents a hydroxyl group, or the like. At least one of $R_1$ represents a group having two or more heteroatoms. l is an integer from 1 to 5. Each of m and n is independently an integer from 0 to 5. Each of $R_7$ and $R_{11}$ independently represents a hydrogen atom, or the like. Each of $R_8$ to $R_{10}$ independently represents a hydrogen atom, or the like. A represents —O—, or the like. D represents a substituted or unsubstituted methylene group, or the like.

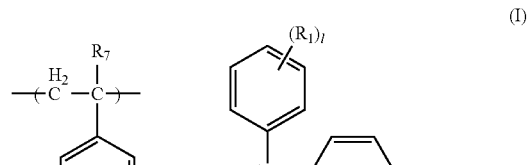

(I)

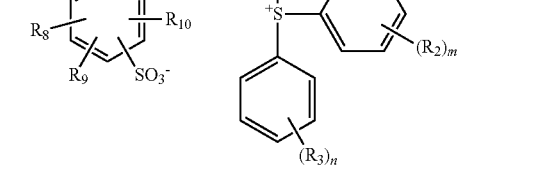

(II)

13 Claims, 1 Drawing Sheet

US 8,632,945 B2

RADIATION-SENSITIVE RESIN COMPOSITION, MONOMER, POLYMER, AND PRODUCTION METHOD OF RADIATION-SENSITIVE RESIN COMPOSITION

CROSS-REFERENCE TO RELATED APPLICATIONS

The present application is a continuation application of International Application No. PCT/JP2010/071398, filed Nov. 30, 2010, which claims priority to Japanese Patent Application No. 2009-278985, filed Dec. 8, 2009, to Japanese Patent Application No. 2010-055039, filed Mar. 11, 2010, and to Japanese Patent Application No. 2010-130463, filed Jun. 7, 2010. The contents of these applications are incorporated herein by reference in their entirety.

BACKGROUND OF THE INVENTION

1. Field of the Invention

The present invention relates to a radiation-sensitive resin composition, a monomer, a polymer, and a production method of a radiation-sensitive resin composition.

2. Discussion of the Background

A semiconductor device (e.g., IC or LSI) production process utilizes lithographic microfabrication using a photoresist composition. Along with an increase in the degree of integration of integrated circuits, it has become necessary to form a sub-micrometer or quarter-micrometer fine pattern. Therefore, i-lines, KrF excimer laser light, or ArF excimer laser light having a short exposure wavelength have been used instead of g-lines. Development of lithography utilizing electron beams, X-rays, or EUV light instead of excimer laser light has also progressed.

Lithography utilizing electron beams or EUV light is considered to be next-generation or third-generation patterning technology, and requires development of a resist that exhibits high sensitivity and high resolution. In particular, an increase in sensitivity is very important for reducing the wafer processing time. However, when increasing the sensitivity of a resist that is used for electron beams or EUV light, a deterioration in resolution and an increase in nano-edge roughness occur. Therefore, development of a resist achieving these properties in combination has been strongly desired. Note that the term "nano-edge roughness" refers to a phenomenon in which the edge of the resist pattern irregularly changes with respect to the substrate in the direction perpendicular to the line direction due to the properties of the resist, so that a difference occurs between the design dimensions and the actual pattern dimensions when viewed from above. The difference from the design dimensions is transferred by an etching step that uses the resist as a mask, and causes a deterioration in electrical properties. As a result, a decrease in yield occurs. In particular, it is very important to reduce the nano-edge roughness when forming a fine pattern having a line width of 0.25 μm or less. High sensitivity, high resolution, an excellent pattern shape, and a low degree of nano-edge roughness have a trade-off relationship. It is very important to achieve these properties at the same time.

It is also important to achieve high sensitivity, high resolution, an excellent pattern shape, and a low degree of nano-edge roughness at the same time when using lithography that utilizes KrF excimer laser light or ArF excimer laser light.

As a resist suitable for a lithographic process utilizing KrF excimer laser light, electron beams, or EUV light, a chemically-amplified resist utilizing an acid catalytic reaction has been mainly used from the viewpoint of increasing sensitivity. A chemically-amplified resist composition containing mainly a phenolic polymer (phenolic acid-labile polymer) that is insoluble or scarcely soluble in an alkaline solution, but becomes soluble in an alkaline solution due to an acid, and an acid generator, has been effectively used as a positive-tone resist.

A chemically-amplified resist has also been used as a resist that is suitable for a lithographic process utilizing ArF excimer laser light. A chemically-amplified resist composition containing mainly an acid-labile group-containing (meth)acrylic polymer that becomes alkali-soluble due to an acid, and an acid generator, has been effectively used as a positive-tone resist.

A resist composition containing a phenolic acid-labile polymer obtained by copolymerizing an acid-labile acrylate monomer, and a compound (sulfonic acid generator) generating a sulfonic acid upon exposure to active rays or radiation, has been known as such a positive-tone resist. Positive-tone resist compositions are disclosed in, for example, U.S. Pat. No. 5,561,194 B, JP 2001-166474 A, JP 2001-166478 A, JP 2003-107708 A, or JP 2001-194792 A.

SUMMARY OF THE INVENTION

According to one aspect of the present invention, a radiation-sensitive resin composition includes a polymer and a solvent. The polymer includes a following repeating unit represented by a general formula (I), a following repeating unit represented by a general formula (II), or a both thereof.

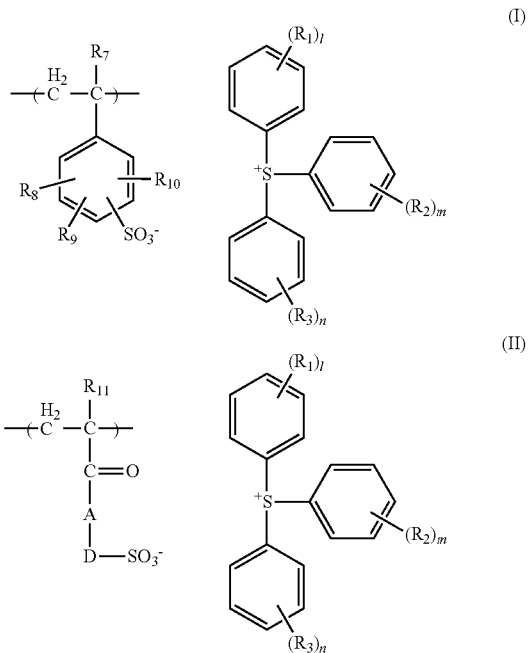

Each of $R_1$ to $R_3$ independently represents a hydroxyl group, a halogen atom, a substituted or unsubstituted alkyl group, a substituted or unsubstituted cycloalkyl group, a substituted or unsubstituted alkoxy group, —S—$R_6$, or a group having two or more heteroatoms, wherein $R_6$ represents a substituted or unsubstituted alkyl group, or a substituted or unsubstituted aryl group, and wherein at least one of $R_1$ represents the group having two or more heteroatoms. l is an integer from 1 to 5. Each of m and n is independently an integer from 0 to 5. Each of $R_7$ and $R_{11}$ independently represents a hydrogen atom, a halogen atom, a cyano group, or a substituted or unsubstituted alkyl group. Each of $R_8$ to $R_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group. A represents —O— or —NR$_{12}$—, wherein R$_{12}$ represents a hydrogen atom, a substituted or unsubstituted alkyl group, or a substituted or unsubstituted aryl group. D represents a substituted or unsubstituted methylene group, a substituted or unsubstituted alkylene group, or a substituted or unsubstituted arylene group.

According to another aspect of the present invention, a radiation-sensitive resin composition includes a polymer, a cation and a solvent. The polymer includes a following repeating unit represented by a general formula (I-a), a following repeating unit represented by a general formula (II-a), or a both thereof, and the cation is represented by a general formula (III).

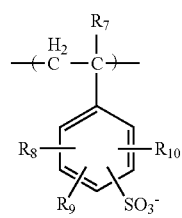
(I-a)

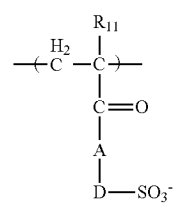
(II-a)

Each of R$_7$ and R$_{11}$ independently represents a hydrogen atom, a halogen atom, a cyano group, or a substituted or unsubstituted alkyl group. Each of R$_8$ to R$_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group. A represents —O— or —NR$_{12}$—, wherein R$_{12}$ represents a hydrogen atom, a substituted or unsubstituted alkyl group, or a substituted or unsubstituted aryl group. D represents a substituted or unsubstituted methylene group, a substituted or unsubstituted alkylene group, or a substituted or unsubstituted arylene group.

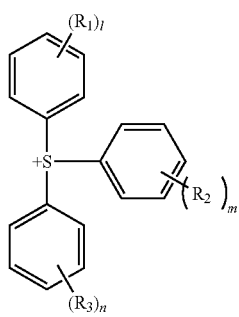
(III)

Each of R$_1$ to R$_3$ independently represents a hydroxyl group, a halogen atom, a substituted or unsubstituted alkyl group, a substituted or unsubstituted cycloalkyl group, a substituted or unsubstituted alkoxy group, —S—R$_6$, or a group having two or more heteroatoms, wherein R$_6$ represents a substituted or unsubstituted alkyl group, or a substituted or unsubstituted aryl group, and wherein at least one of R$_1$ represents the group having two or more heteroatoms. l is an integer from 1 to 5. Each of m and n is independently an integer from 0 to 5.

According to further aspect of the present invention, a monomer is represented by a following general formula (I-m) or a following general formula (II-m).

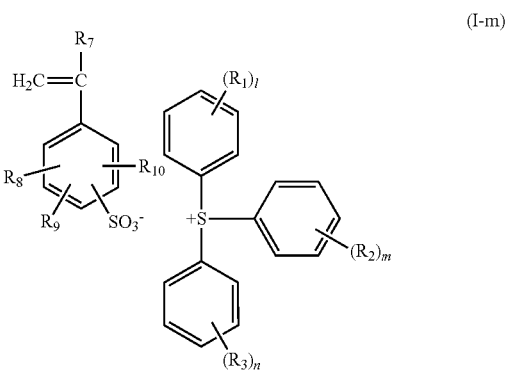
(I-m)

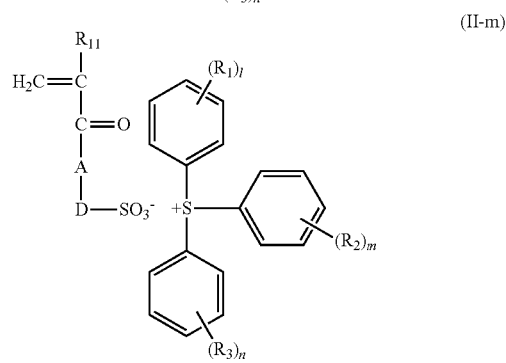
(II-m)

Each of R$_1$ to R$_3$ independently represents a hydroxyl group, a halogen atom, a substituted or unsubstituted alkyl group, a substituted or unsubstituted cycloalkyl group, a substituted or unsubstituted alkoxy group, —S—R$_6$, or a group having two or more heteroatoms, wherein R$_6$ represents a substituted or unsubstituted alkyl group, or a substituted or unsubstituted aryl group, and wherein at least one of R$_1$ represents the group having two or more heteroatoms. l is an integer from 1 to 5. Each of m and n is independently an integer from 0 to 5. Each of R$_7$ and R$_{11}$ independently represents a hydrogen atom, a halogen atom, a cyano group, or a substituted or unsubstituted alkyl group. Each of R$_8$ to R$_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group. A represents —O— or —NR$_{12}$—, wherein R$_{12}$ represents a hydrogen atom, a substituted or unsubstituted alkyl group, or a substituted or unsubstituted aryl group. D represents a substituted or unsubstituted methylene group, a substituted or unsubstituted alkylene group, or a substituted or unsubstituted arylene group.

According to further aspect of the present invention, a polymer includes a following repeating unit represented by a general formula (I), a following repeating unit represented by a general formula (II) or a both thereof.

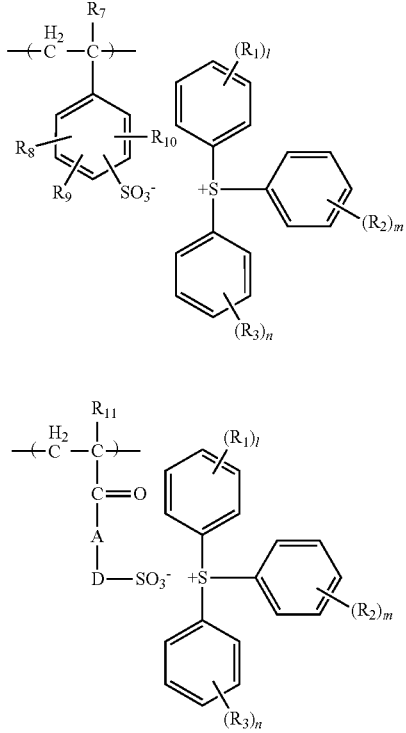

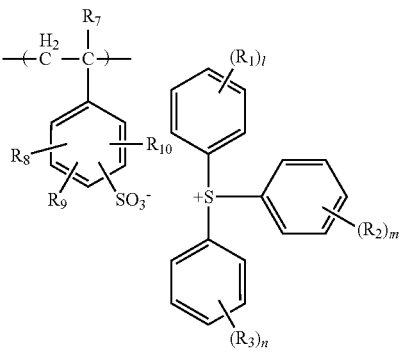

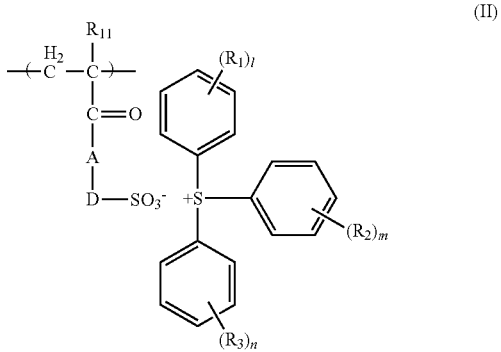

Each of $R_1$ to $R_3$ independently represents a hydroxyl group, a halogen atom, a substituted or unsubstituted alkyl group, a substituted or unsubstituted cycloalkyl group, a substituted or unsubstituted alkoxy group, —S—$R_6$, or a group having two or more heteroatoms, wherein $R_6$ represents a substituted or unsubstituted alkyl group, or a substituted or unsubstituted aryl group, and wherein at least one of $R_1$ represents the group having two or more heteroatoms. l is an integer from 1 to 5. Each of m and n is independently an integer from 0 to 5. Each of $R_7$ and $R_{11}$ independently represents a hydrogen atom, a halogen atom, a cyano group, or a substituted or unsubstituted alkyl group. Each of $R_8$ to $R_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group. A represents —O— or —$NR_{12}$—, wherein $R_{12}$ represents a hydrogen atom, a substituted or unsubstituted alkyl group, or a substituted or unsubstituted aryl group. D represents a substituted or unsubstituted methylene group, a substituted or unsubstituted alkylene group, or a substituted or unsubstituted arylene group.

According to further aspect of the present invention, a production method of a radiation-sensitive resin composition includes mixing a polymer and a solvent. The polymer includes a following repeating unit represented by a general formula (I), a following repeating unit represented by a general formula (II), or a both thereof.

Each of $R_1$ to $R_3$ independently represents a hydroxyl group, a halogen atom, a substituted or unsubstituted alkyl group, a substituted or unsubstituted cycloalkyl group, a substituted or unsubstituted alkoxy group, —S—$R_6$, or a group having two or more heteroatoms, wherein $R_6$ represents a substituted or unsubstituted alkyl group, or a substituted or unsubstituted aryl group, and wherein at least one of $R_1$ represents the group having two or more heteroatoms. l is an integer from 1 to 5. Each of m and n is independently an integer from 0 to 5. Each of $R_7$ and $R_{11}$ independently represents a hydrogen atom, a halogen atom, a cyano group, or a substituted or unsubstituted alkyl group. Each of $R_8$ to $R_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group. A represents —O— or —$NR_{12}$—, wherein $R_{12}$ represents a hydrogen atom, a substituted or unsubstituted alkyl group, or a substituted or unsubstituted aryl group. D represents a substituted or unsubstituted methylene group, a substituted or unsubstituted alkylene group, or a substituted or unsubstituted arylene group.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
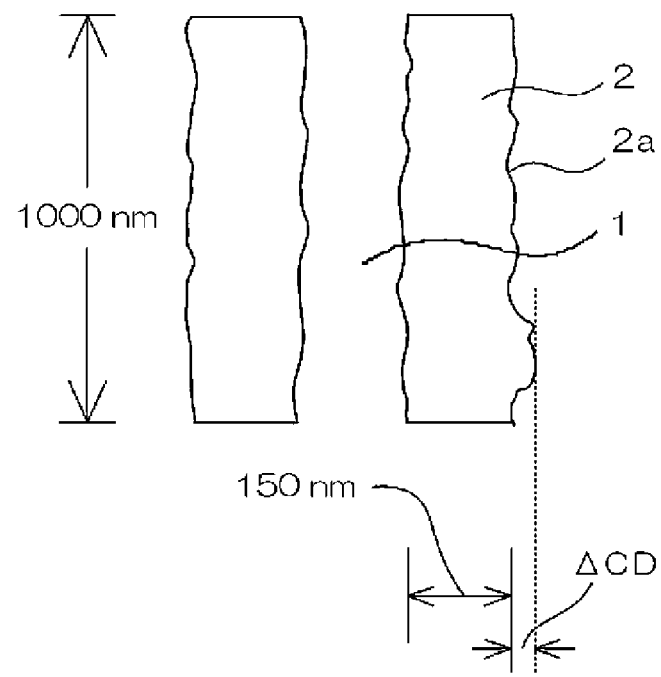
FIG. 1 is a plan view schematically showing a line pattern.

The embodiment of the present invention is as follows.
1. A radiation-sensitive resin composition comprising a polymer and a solvent, wherein the polymer includes at least one of a repeating unit represented by the following formula (I) and a repeating unit represented by the following general formula (II),

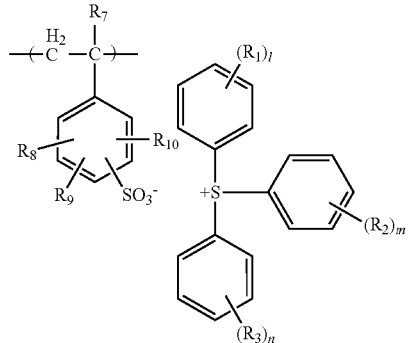
(I)

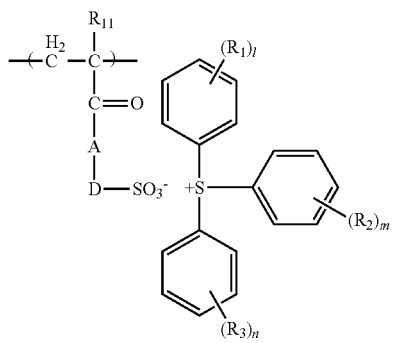
(II)

wherein $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, m and n are independently an integer from 0 to 5, $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group.

2. A radiation-sensitive resin composition comprising a polymer, a cation, and a solvent, wherein the polymer includes at least one of the following repeating unit represented by a general formula (I-a) and the following repeating unit represented by a general formula (II-a), and the cation is represented by a general formula (III),

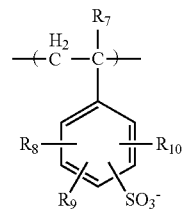
(I-a)

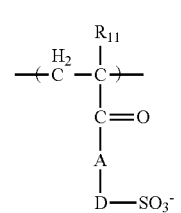
(II-a)

wherein $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group,

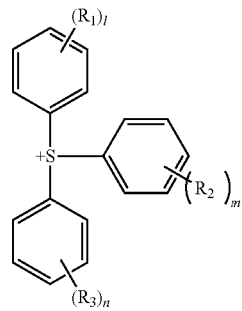
(III)

wherein $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, and m and n are independently an integer from 0 to 5.

3. The radiation-sensitive resin composition according to 1 or 2 above, wherein the heteroatoms are at least two heteroatoms selected from the group consisting of a sulfur atom (S), an oxygen atom (O), and a nitrogen atom (N).

4. The radiation-sensitive resin composition according to any one of 1 to 3 above,
wherein the group having two or more heteroatoms is at least one of —$OSO_2$—Rx and —$SO_2$—Rx (wherein Rx independently represents a substituted or unsubstituted alkyl group, a substituted or unsubstituted cycloalkyl group, a substituted or unsubstituted alkoxy group, or a substituted or unsubstituted aryl group).

5. The radiation-sensitive resin composition according to any one of 1 to 4 above, wherein the polymer further includes a structural unit containing an acid-labile group.

6. The radiation-sensitive resin composition according to 5 above, wherein the acid-labile group-containing structural unit comprises a structural unit represented by the following general formula (c-1),

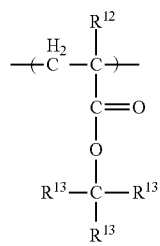

(c-1)

wherein $R^{12}$ independently represents a hydrogen atom, a methyl group, a trifluoromethyl group, or a hydroxymethyl group, and $R^{13}$ independently represent a linear or branched alkyl group having 1 to 4 carbon atoms, a monovalent alicyclic hydrocarbon group having 4 to 20 carbon atoms, a group derived therefrom, or a substituted or unsubstituted aryl group having 6 to 22 carbon atoms, or two of $R^{13}$ bond to each other to form a divalent alicyclic hydrocarbon group having 4 to 20 carbon atoms, or a group derived therefrom, together with a carbon atom that is bonded thereto, and remaining $R^{13}$ represents a linear or branched alkyl group having 1 to 4 carbon atoms, a monovalent alicyclic hydrocarbon group having 4 to 20 carbon atoms, a group derived therefrom, or a substituted or unsubstituted aryl group having 6 to 22 carbon atoms.

7. The radiation-sensitive resin composition according to any one of 1 to 6 above, further comprising a compound represented by the following general formula (B1),

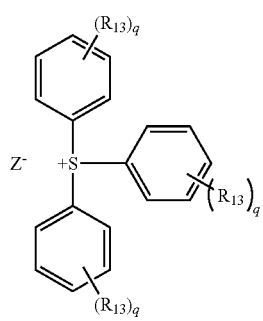

(B1)

wherein $R_{13}$ independently represent a monovalent organic group, $Z^-$ represents $R_{15}O^-$ or $R_{15}COO^-$ (wherein $R_{15}$ represents a monovalent organic group), and q are independently an integer from 0 to 5.

8. A monomer represented by the following general formula (I-m) or (II-m),

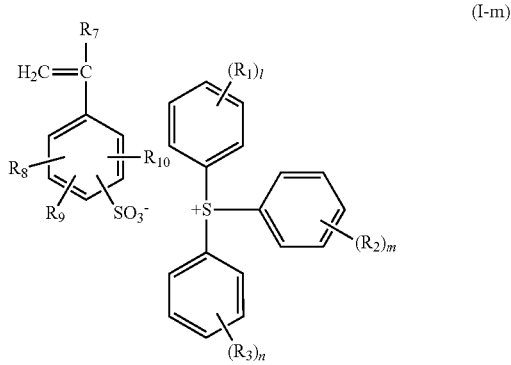

(I-m)

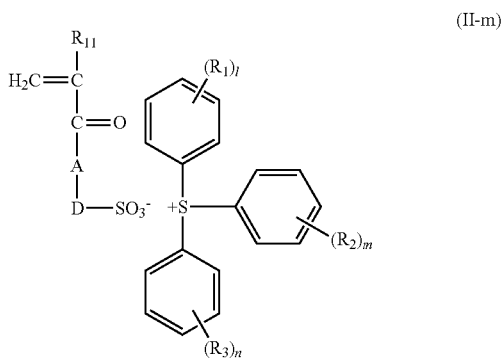

(II-m)

wherein $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, m and n are independently an integer from 0 to 5, $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group.

9. A polymer comprising at least one of the following repeating unit represented by a general formula (I) and the following repeating unit represented by a general formula (II),

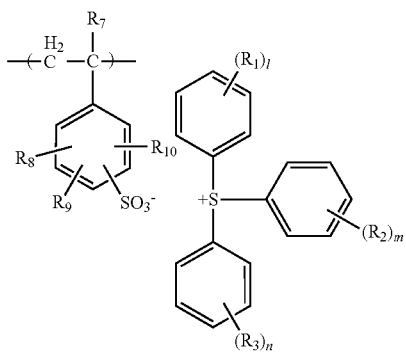
(I)

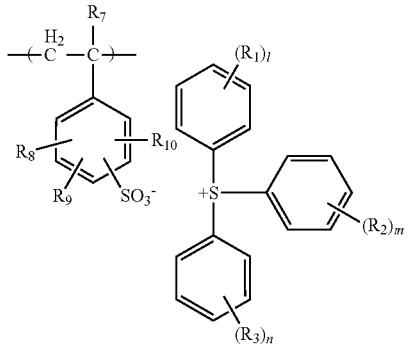
(I)

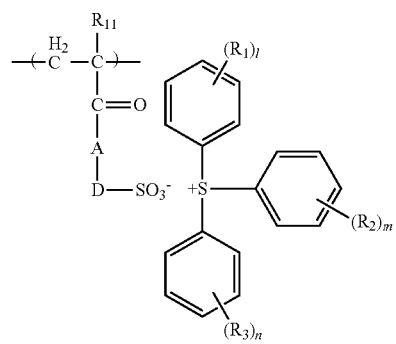
(II)

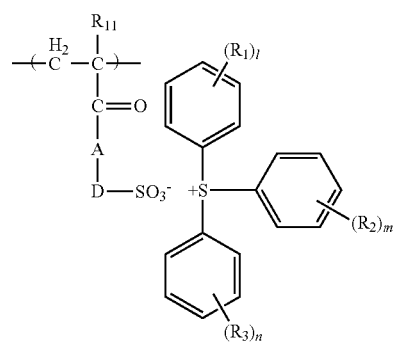
(II)

wherein $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, m and n are independently an integer from 0 to 5, $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group.

10. A production method of a radiation-sensitive resin composition comprising mixing a polymer comprising at least one of the following repeating unit represented by a general formula (I) and the following repeating unit represented by a general formula (II), and a solvent, wherein $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, m and n are independently an integer from 0 to 5, $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group.

According to the radiation-sensitive resin composition of the embodiment of the present invention, a chemically-amplified positive-tone resist film can be obtained which is effectively sensitive to radiation including KrF excimer laser light, ArF excimer laser light, an (extreme) deep ultraviolet ray such as EUV light, X-rays such as synchrotron radiation, and electron beams, has excellent nano-edge roughness, sensitivity and resolution, and is capable of stably and highly accurately forming a fine pattern.

The novel polymer of the embodiment of the present invention generates a sulfonic acid upon exposure to electron beams, (extreme) deep ultraviolet rays, or the like, and may suitably be used as a polymer component of the radiation-sensitive resin composition.

The novel monomer of the embodiment of the present invention is suitably used for leading the polymer.

According to the method for producing a radiation-sensitive resin composition of the embodiment of the present invention, a radiation-sensitive resin composition can be easily produced which is effectively sensitive to radiation including KrF excimer laser light, ArF excimer laser light, an (extreme) deep ultraviolet ray such as EUV light, X-rays such as synchrotron radiation, and electron beams, has excellent nano-edge roughness, sensitivity and resolution, and is capable of stably and highly accurately forming a fine pattern.

The embodiments will now be described with reference to the accompanying drawings, wherein like reference numerals designate corresponding or identical elements throughout the various drawings.

1. Radiation-Sensitive Resin Composition (I)

The radiation-sensitive resin composition (i) according to one embodiment of the invention is characterized by including a specific polymer and a solvent.

1-1. Polymer (A)

The radiation-sensitive resin composition according to one embodiment of the invention includes a polymer having at least one of a repeating unit represented by the following general formula (I) and a repeating unit represented by the following general formula (II) (hereinafter may be referred to as "polymer (A)") as a polymer component.

The polymer (A) is insoluble or scarcely soluble in an alkali, but becomes readily soluble in an alkali due to an acid.

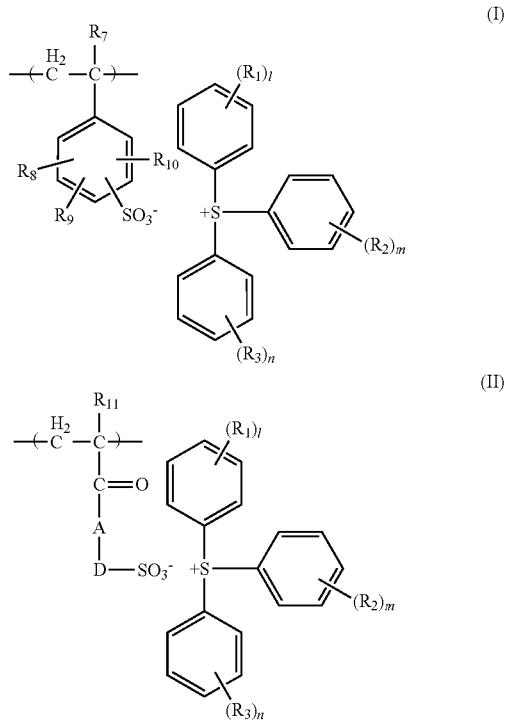

(In the general formulae (I) and (II), $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, m and n are independently an integer from 0 to 5, $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group.)

Examples of the halogen atom for $R_1$ to $R_3$ in the general formulae (I) and (II) include a fluorine atom, a chlorine atom, a bromine atom, an iodine atom, and the like.

Examples of the alkyl group for $R_1$ to $R_3$ include a methyl group, an ethyl group, a n-propyl group, an i-propyl group, a n-butyl group, a 2-methylpropyl group, a 1-methyl propyl group, a t-butyl group, and the like. Among these, alkyl groups having 1 to 4 carbon atoms are preferred.

Examples of the cycloalkyl group for $R_1$ to $R_3$ include a cyclopropyl group, a cyclobutyl group, a cyclopentyl group, a cyclohexyl group, a cycloheptyl group, a cyclooctyl group, and the like. Among these, cycloalkyl groups having 5 to 6 carbon atoms are preferred.

Examples of the alkoxy group for $R_1$ to $R_3$ include a methoxy group, an ethoxy group, a n-propoxy group, an i-propoxy group, a n-butoxy group, a 2-methylpropoxy group, a 1-methylpropoxy group, a t-butoxy group, and the like. Among these, alkoxy groups having 1 to 4 carbon atoms are preferred.

Note that one or more hydrogen atoms of the alkyl group, the cycloalkyl group, and the alkoxy group may be substituted with a substituent. Specific examples of the substituent include a halogen atom such as fluorine atom, chlorine atom, and bromine atom, a phenyl group, an acetoxy group, an alkyl group, an alkoxy group, and the like.

Examples of the alkyl group represented by $R_6$ in —S—$R_6$ for $R_1$ to $R_3$ include a methyl group, an ethyl group, a n-propyl group, an i-propyl group, a n-butyl group, a 2-methylpropyl group, a 1-methyl propyl group, a t-butyl group, and the like.

Examples of aryl group for $R_6$ include a phenyl group, a 1-naphthyl group, a 2-naphthyl group, a 1-anthryl group, a 1-phenanthryl group, and the like. Among these, aryl groups having 6 to 12 carbon atoms are preferred.

Note that one or more hydrogen atoms of the alkyl group and the aryl group for $R_6$ may be substituted with a substituent. Examples of the substituent include those mentioned above.

The group having two or more heteroatoms for $R_1$ to $R_3$ is not particularly limited. It is considered that the acid generation efficiency is improved when at least one of $R_1$ to $R_3$ represents the group having two or more heteroatoms, so that a low degree of nano-edge roughness, excellent sensitivity, and excellent resolution can be achieved.

Examples of the heteroatom include a sulfur atom (S), an oxygen atom (O), and a nitrogen atom (N). It is preferable that the two or more heteroatoms be at least two heteroatoms selected from a sulfur atom (S), an oxygen atom (O), and a nitrogen atom (N).

Examples of the group having two or more heteroatoms include —$OSO_2$—Rx, —$SO_2$—Rx, —O—CO—Rx, —CO—O—Rx, —CONH—Rx, —$SO_2$N(Ry)-Rx (wherein Rx represents a substituted or unsubstituted alkyl group, a substituted or unsubstituted cycloalkyl group, a substituted or unsubstituted alkoxy group, or a substituted or unsubstituted aryl group, and Ry represents a hydrogen atom, a substituted or unsubstituted alkyl group, a substituted or unsubstituted cycloalkyl group, a substituted or unsubstituted alkoxy group, or a substituted or unsubstituted aryl group, provided that Rx does not represent an alkoxy group when the group having two or more heteroatoms is —CO—O—Rx). It is preferable that the group having two or more heteroatoms be at least one of –OSO$_2$—Rx and —SO$_2$—Rx from the viewpoint of the acid generation efficiency. Examples of a preferable substituent that may substitute the group represented by Rx include a halogen atom.

Examples of the alkyl group for Rx include linear or branched alkyl groups having 1 to 10 carbon atoms.

Examples of the alkyl group include a methyl group, an ethyl group, a n-propyl group, an i-propyl group, a n-butyl group, a s-butyl group, a t-butyl group, an i-butyl group, a n-pentyl group, an i-pentyl propyl group, a neopentyl group, and the like.

The alkyl group may have a substituent. Examples of the substituent include a halogen atom, a hydroxyl group, and a carboxyl group.

Examples of the cycloalkyl group for Rx include monocyclic or polycyclic cycloalkyl groups having 4 to 15 carbon atoms.

Examples of the cycloalkyl group include a cyclobutyl group, a cyclopentyl group, a cyclohexyl group, a cycloheptyl group, a cyclooctyl group, a norbornyl group, a tricyclodecanyl group, a tetracyclodecanyl group, an adamantly group, and the like.

The cycloalkyl group may have a substituent. Examples of the substituent include an alkyl group having 1 to 4 carbon atoms, a halogen atom, a hydroxyl group, and a carboxyl group.

Examples of the alkoxy group for Rx include linear or branched alkoxy groups having 1 to 10 carbon atoms.

Examples of the alkoxy group include a methoxy group, an ethoxy group, a propoxy group, an i-propoxy group, a butoxy group, and the like.

The alkoxy group may have a substituent. Examples of the substituent include a halogen atom, a hydroxyl group, and a carboxyl group.

Examples of the aryl group for Rx include a phenyl group, a naphthyl group, an anthranyl group.

The aryl group may have a substituent. Examples of the substituent include an alkyl group having 1 to 4 carbon atoms, a halogen atom, a hydroxyl group, and a carboxyl group.

Ry represents a hydrogen atom or any of the groups mentioned above in connection with Rx.

Specific examples of the group having two or more heteroatoms include groups represented by the following formulae (h1) to (h15), and the like. Among these, groups represented by the formulae (h1) and (h2) are preferred.

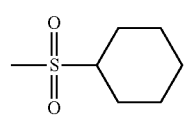

(h1)

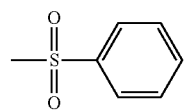

(h2)

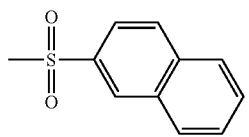

(h3)

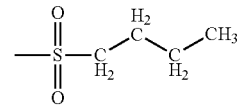

(h4)

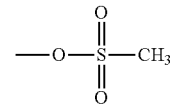

(h5)

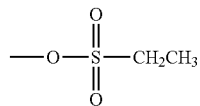

(h6)

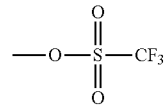

(h7)

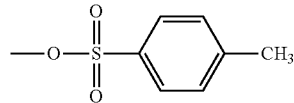

(h8)

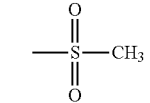

(h9)

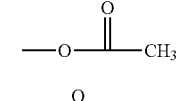

(h10)

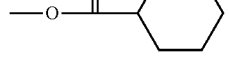

(h11)

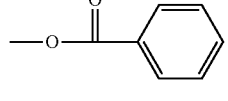

(h12)

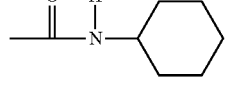

(h13)

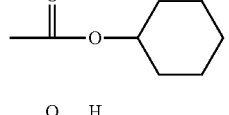

(h14)

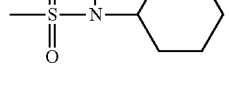

(h15)

In the general formulae (I) and (II), l is an integer from 1 to 5. m and n are independently an integer from 0 to 5. It is preferable that "l+m+n" be an integer from 1 to 2. Specifically, the repeating unit represented by the general formula (I)

and the repeating unit represented by the general formula (II) include at least one group having two or more heteroatoms.

Examples of the halogen atom for $R_7$ to $R_{11}$ in the general formulae (I) and (II) include a fluorine atom, a chlorine atom, a bromine atom, an iodine atom, and the like.

Examples of the alkyl group for $R_7$ to $R_{11}$ include a methyl group, an ethyl group, a n-propyl group, an i-propyl group, a n-butyl group, a 2-methylpropyl group, a 1-methylpropyl group, a t-butyl group, and the like. Among these, alkyl groups having 1 to 4 carbon atoms are preferred.

Note that one or more hydrogen atoms of the alkyl group may be substituted with the above-mentioned substituent.

Examples of the aralkyl group for $R_8$ to $R_{10}$ include a benzyl group, a phenethyl group, a naphthylmethyl group, a naphthlethyl group, and the like. Among these, aralkyl groups having 6 to 12 carbon atoms are preferred.

Examples of the alkoxy group for $R_8$ to $R_{10}$ include a methoxy group, an ethoxy group, a n-propoxy group, an i-propoxy group, a n-butoxy group, a 2-methylpropoxy group, a 1-methylpropoxy group, a t-butoxy group, and the like. Among these, alkoxy groups having 1 to 4 carbon atoms are preferred.

Note that one or more hydrogen atoms of the aralkyl group and the alkoxy group in $R_8$ to $R_{10}$ may be substituted with a substituent.

Examples of the alkyl group for $R_{12}$ in —$NR_{12}$— group for A in the general formula (II) include a methyl group, an ethyl group, a n-propyl group, an i-propyl group, a n-butyl group, a 2-methylpropyl group, a 1-methylpropyl group, a t-butyl group, and the like. Among these, alkyl groups having 1 to 6 carbon atoms are preferred.

Examples of aryl group for $R_{12}$ include a phenyl group, a 1-naphthyl group, a 2-naphthyl group, a 1-anthryl group, a 1-phenanthryl group, and the like. Among these, aryl groups having 6 to 12 carbon atoms are preferred.

Note that one or more hydrogen atoms of the alkyl group and aryl group may be substituted with the above-mentioned substituent.

Examples of the alkylene group for D in the general formula (II) include an ethylene group; a propylene group such as a 1,3-propylene group and a 1,2-propylene group; a tetramethylene group; a pentamethylene group; a hexamethylene group; a 1-methyl-1,3-propylene group, a 2-methyl-1,3-propylene group, a 2-methyl-1,2-propylene group, a 1-methyl-1,4-butylene group, a 2-methyl-1,4-butylene group, and the like. Among these, alkylene groups having 2 to 6 carbon atoms are preferred.

Examples of the arylene group for D include a phenylene group, a naphthylene group, a methylphenylene group, an ethylphenylene group, a chlorophenylene group, a bromophenylene group, a fluorophenylene group, and the like. Among these, arylene groups having 6 to 12 carbon atoms are preferred.

Note that one or more hydrogen atoms of the methylene group, alkylene group and arylene group may be substituted with the above-mentioned substituent.

The repeating unit represented by the general formula (I) can be obtained using a compound represented by the following general formula (I-m) as a monomer, and the repeating unit represented by the general formula (II) can be obtained using a compound represented by the following general formula (II-m) as a monomer, for example.

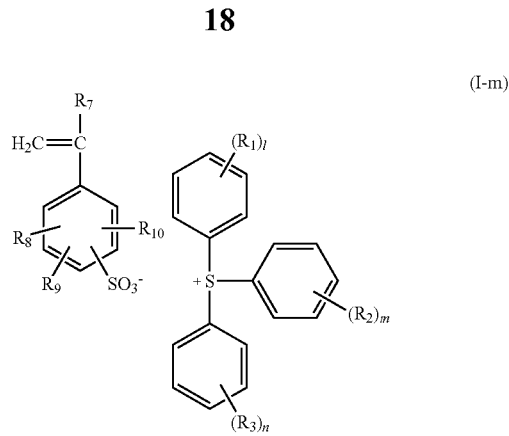

(I-m)

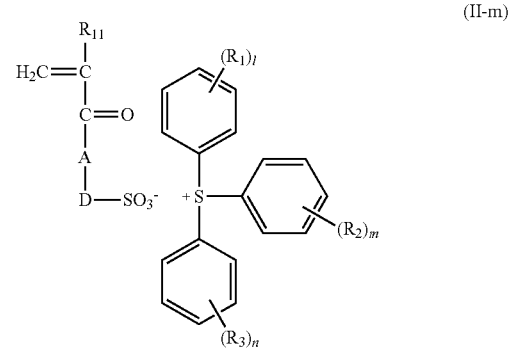

(II-m)

(In the general formulae (I-m) and (II-m), $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, m and n are independently an integer from 0 to 5, $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group.)

$R_1$ to $R_3$, $R_7$ to $R_{11}$, l, m, n, A, and D in the general formulae (I-m) and (II-m) are the same as defined for $R_1$ to $R_3$, $R_7$ to $R_{11}$, l, m, n, A, and D in the general formulae (I) and (II).

Specific examples of the monomers represented by the general formulae (I-m) and (II-m) include compounds represented by the following formulae (1-1) to (1-5), compounds represented by the following formulae (II-1) to (II-21), and the like.

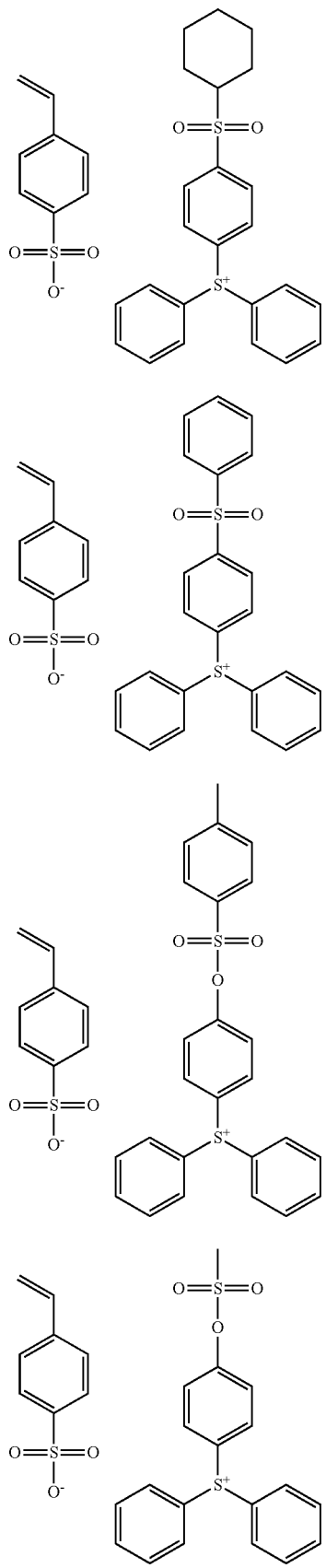
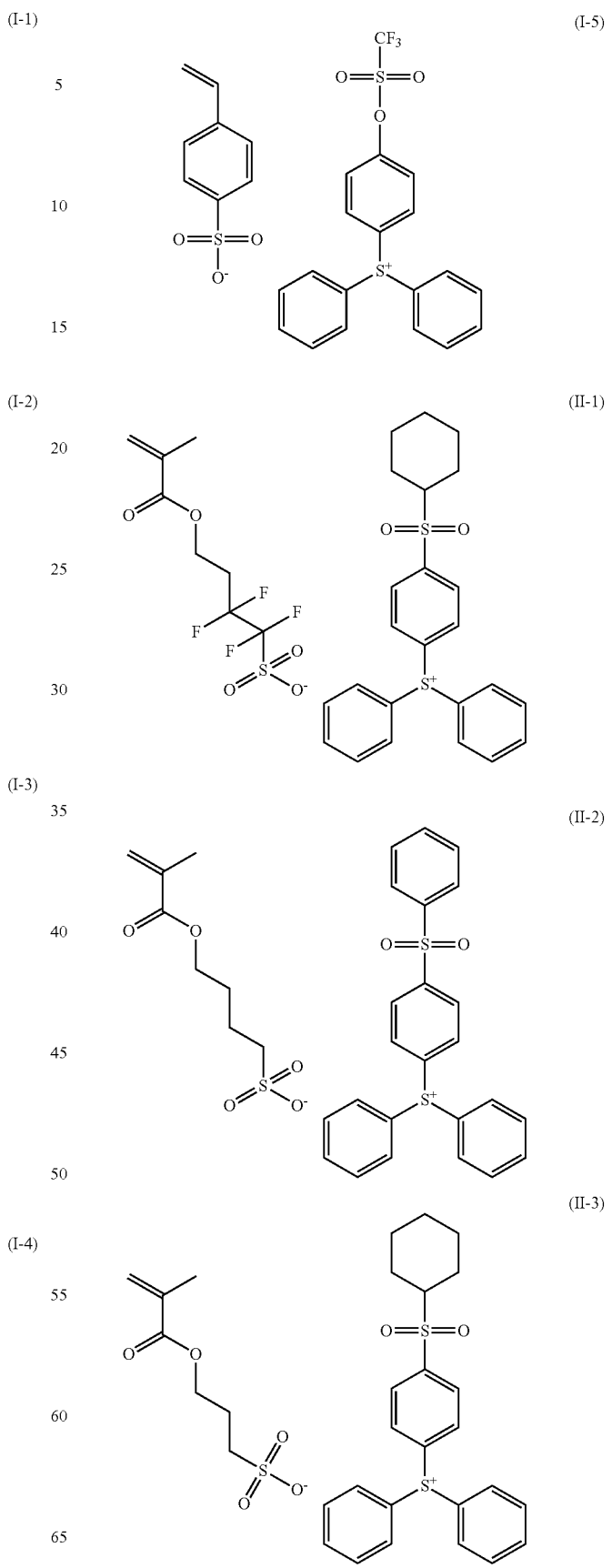

(II-4)
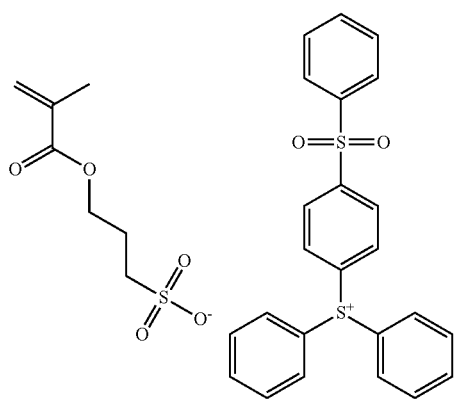
(II-5)
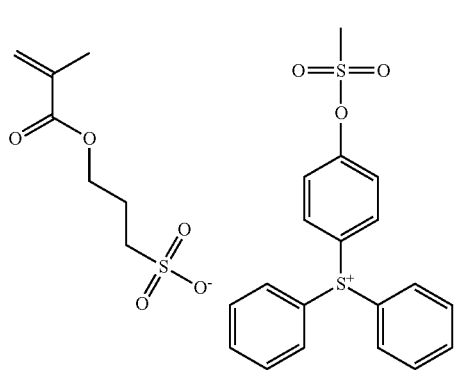
(II-6)
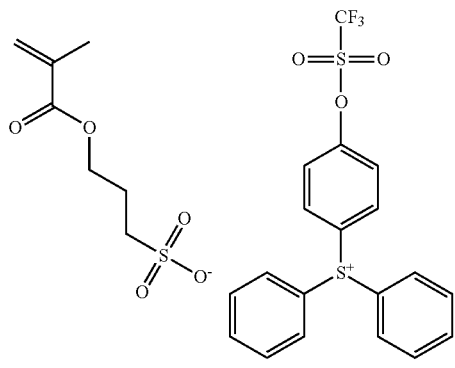
(II-7)
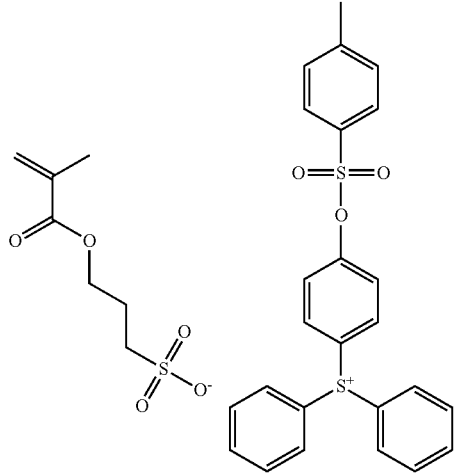
(II-8)
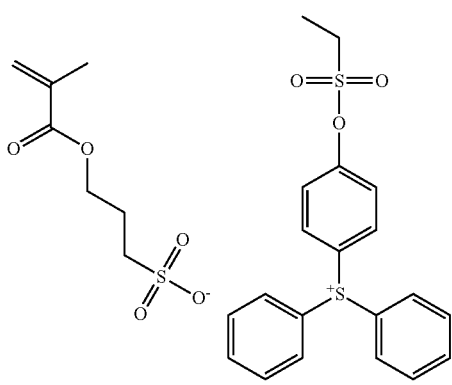
(II-9)
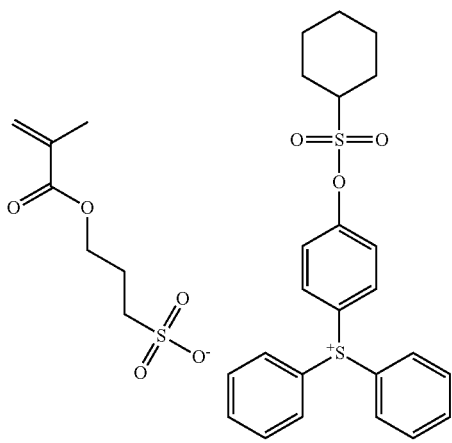
(II-10)
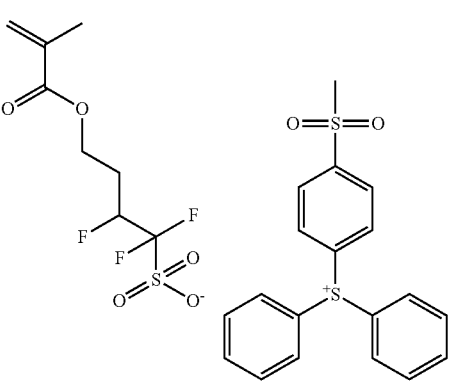
(II-11)
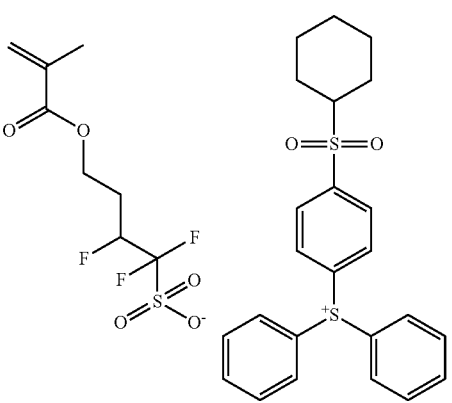

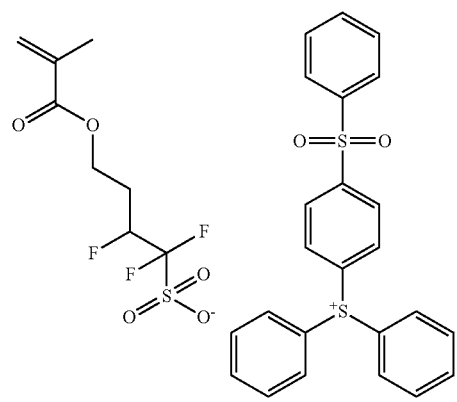
(II-12)
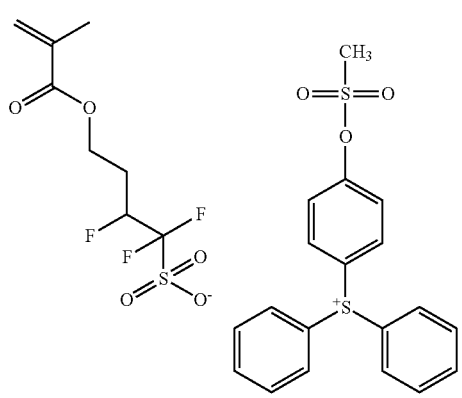
(II-13)
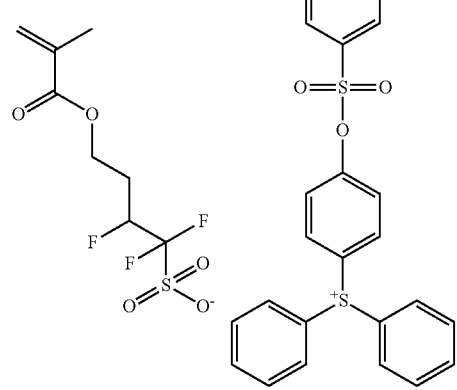
(II-14)
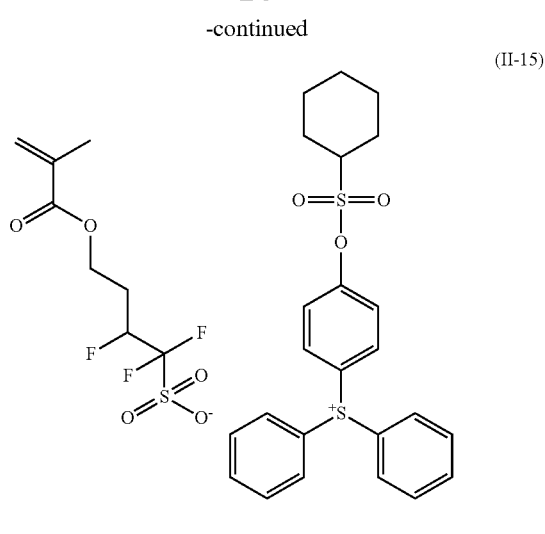
(II-15)
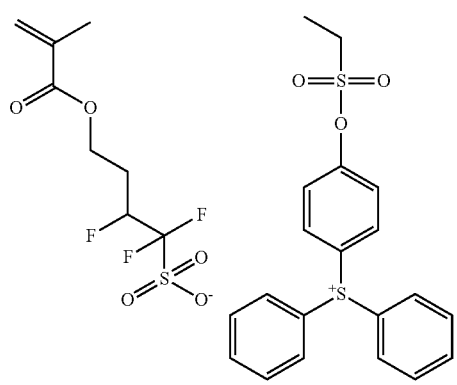
(II-16)
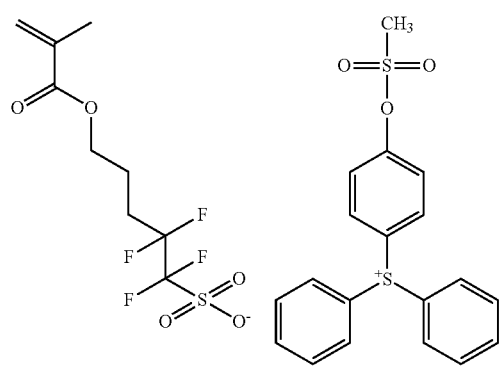
(II-17)
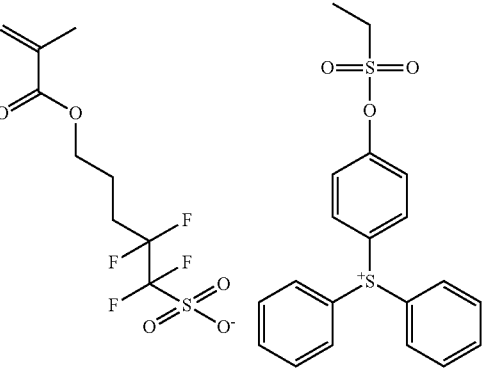
(II-18)

-continued

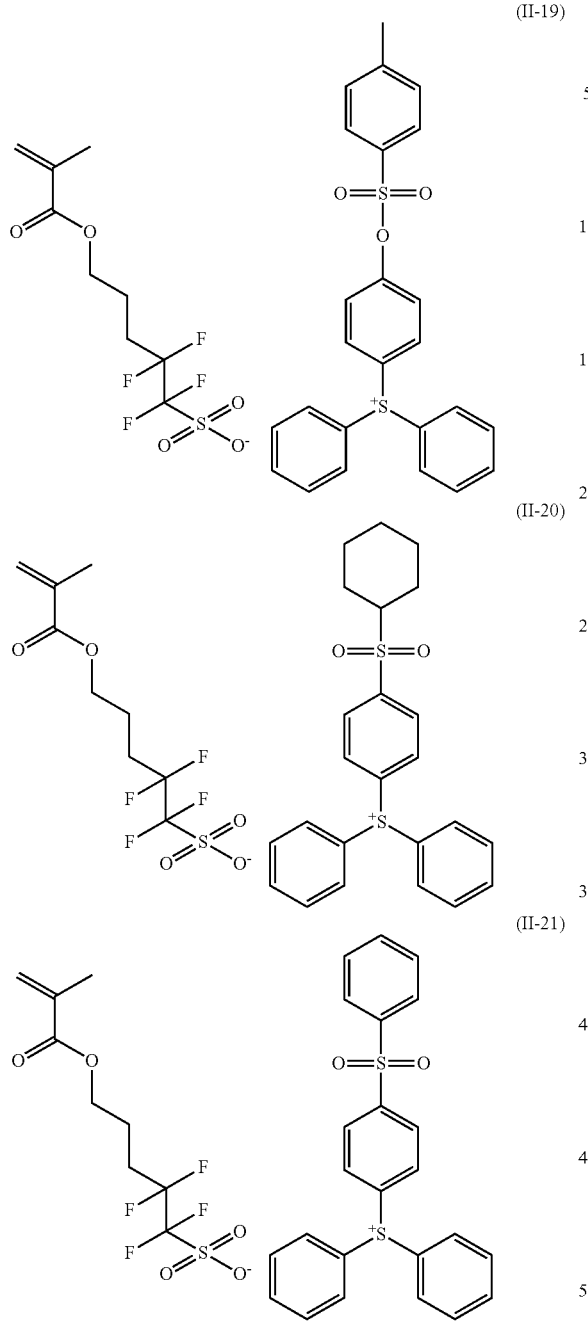

(II-19)

(II-20)

(II-21)

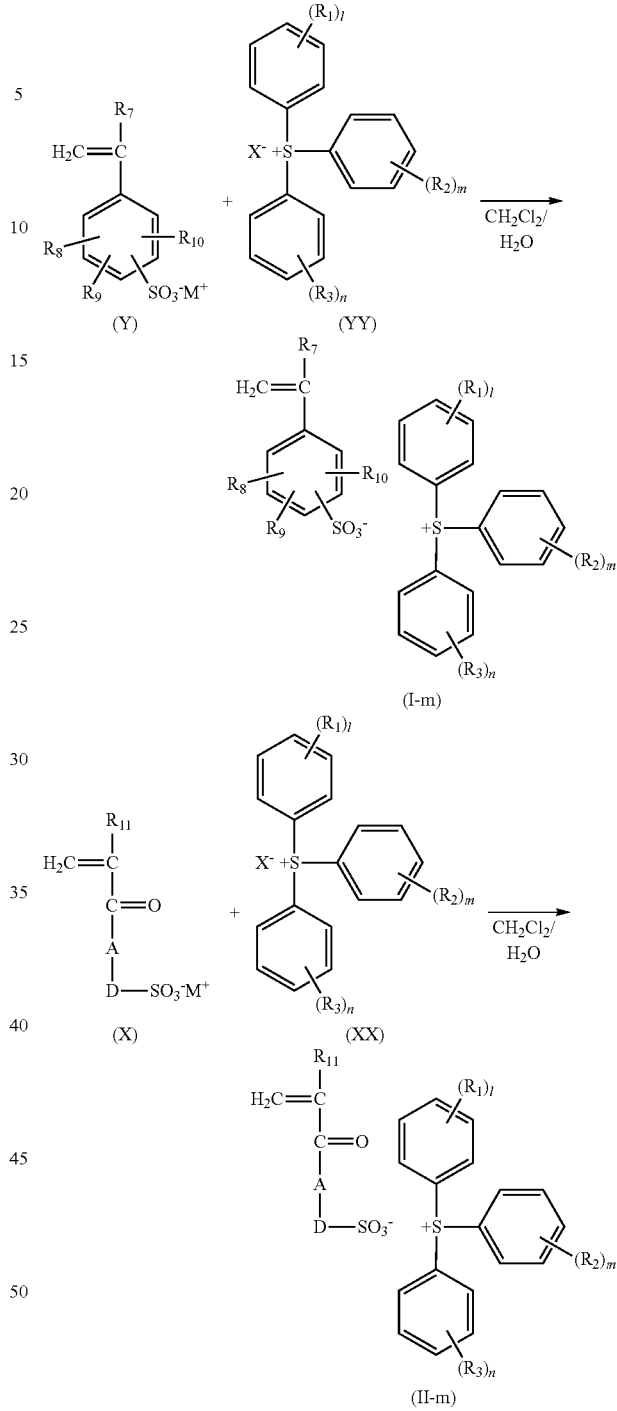

The monomer represented by the general formula (I-m) can be produced by reacting a compound represented by the following general formula (Y) with a compound represented by the following general formula (YY) in a methylene chloride/water mixed solvent (see below), for example.

The monomer represented by the general formula (II-m) can be produced by reacting a compound represented by the following general formula (X) with a compound represented by the following general formula (XX) in a methylene chloride/water mixed solvent (see below), for example.

The compound represented by the general formula (XX) or (YY) can be produced by the method disclosed in Japanese Patent Application Publication (KOKAI) No. 2003-423516, for example.

$R_1$ to $R_3$, $R_7$ to $R_{11}$, l, m, n, A, and D in the general formulae (Y), (YY), (I-m), (X), (XX), and (II-m) are the same as defined for $R_1$ to $R_3$, $R_7$ to $R_{11}$, l, m, n, A, and D in the general formulae (I) and (II). $M^+$ represents an alkali metal ion, and $X^-$ represents a halide ion.

The polymer (A) may include a repeating unit represented by the following general formula (1) (hereinafter referred to as "repeating unit (1)") in addition to the repeating unit (I) and repeating unit (II).

When the polymer (A) includes the repeating unit (1), the polymer (A) becomes sufficiently readily soluble in an alkali due to an acid.

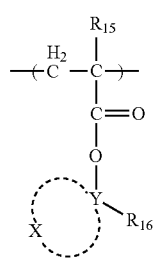

(1)

(In the general formula (1), $R_{15}$ represents a hydrogen atom, a methyl group, a fluorine atom, or a trifluoromethyl group, $R_{16}$ represents a substituted or unsubstituted aryl group having 6 to 22 carbon atoms, X represents an atomic group that forms an alicyclic hydrocarbon group together with Y, and Y represents a carbon atom.)

In the general formula (1), the number of carbon atoms of the alicyclic hydrocarbon group formed by X together with Y is not particularly limited and is preferably in the range from 5 to 25, more preferably from 5 to 20, and further preferably from 5 to 15.

The alicyclic hydrocarbon group may be either monocyclic or polycyclic. Specific examples of the structure of the alicyclic hydrocarbon group include structures represented by the following formulae (a-1) to (a-50), and the like.

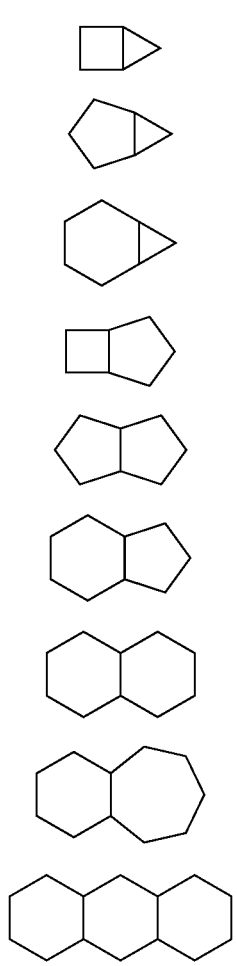

(a-1)
(a-2)
(a-3)
(a-4)
(a-5)
(a-6)
(a-7)
(a-8)
(a-9)

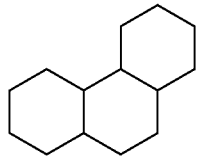

(a-10)

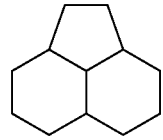

(a-11)

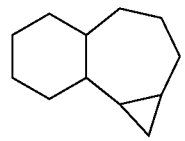

(a-12)

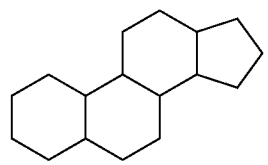

(a-13)

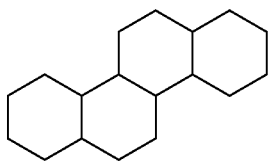

(a-14)

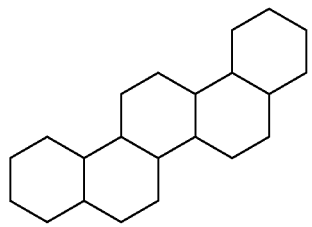

(a-15)

(a-16)

(a-17)

(a-18)

(a-19)

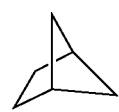

(a-20)

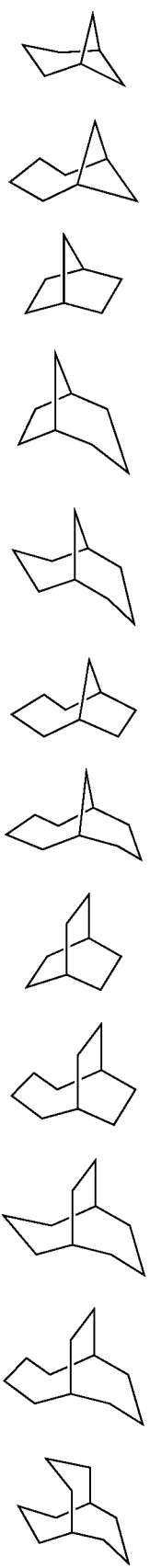
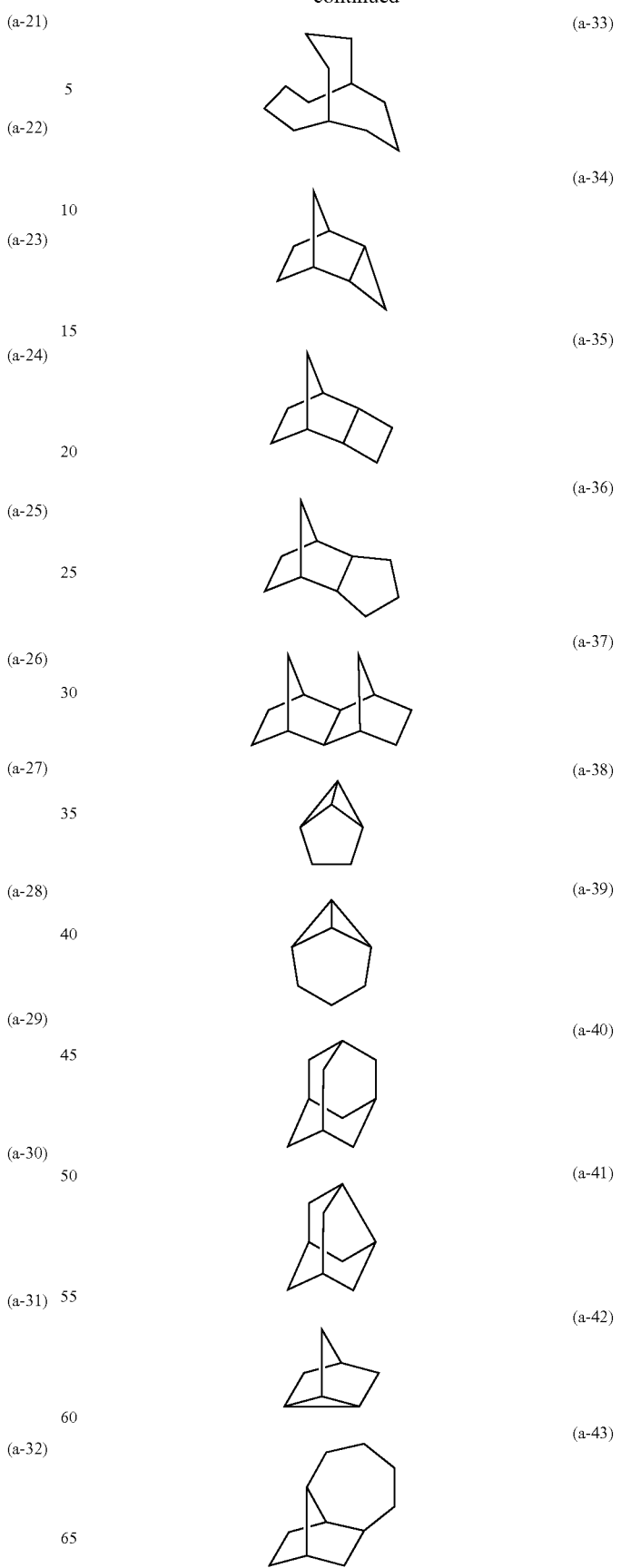

-continued

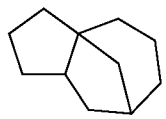 (a-44)

 (a-45)

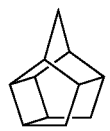 (a-46)

 (a-47)

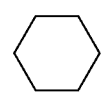 (a-48)

 (a-49)

 (a-50)

The alicyclic hydrocarbon group formed by X together with Y in the general formula (1) is preferably a group having a monocyclic structure, a bicyclic structure, a tricyclic structure, or a tetracyclic structure.

Specific examples of the alicyclic hydrocarbon group include a cycloalkyl group such as a cyclopentyl group, a cyclohexyl group, a cycloheptyl group, a cyclooctyl group, a cyclodecanyl group, and a cyclododecanyl group; an adamantyl group, a noradamantyl group, a decalin residue (decalinyl group), a tricyclodecanyl group, a tetracyclododecanyl group, a norbornyl group, a cedrol group, and the like.

Among these, preferred is a cycloalkyl group such as a cyclopentyl group, a cyclohexyl group, a cycloheptyl group, a cyclooctyl group, a cyclodecanyl group, and a cyclododecanyl group; an adamantyl group, a decalin residue or a norbornyl group. A cycloalkyl group having 5 to 15 carbon atoms is particularly preferable.

The alicyclic hydrocarbon group may be either substituted or unsubstituted. Specific examples of the substituent include a hydroxyl group, a carboxyl group, a halogen atom such as a fluorine atom and a bromine atom, an alkoxy group such as a methoxy group, a ethoxy group, a propoxy group, and a butoxy group, an alkyloxycarbonyl group, and the like.

Examples of the aryl group having 6 to 22 carbon atoms for $R_{16}$ include groups derived from the structures represented by the following formulae (x-1) to (x-3), and the like. When $R_{16}$ represents a group (i.e., naphthyl group) derived from the structure represented by the formula (x-2), $R_{16}$ may be bonded to Y in the general formula (1) at the 1-position or the 2-position. When $R_{16}$ represents a group (i.e., anthryl group) derived from the structure represented by the formula (x-3), $R_{16}$ may be bonded to Y in the general formula (1) at the 1-position, the 2-position, or the 9-position.

The aryl group may be either substituted or unsubstituted. Specific examples of the substituent include a hydroxyl group, a carboxyl group, a halogen atom such as a fluorine atom, a chlorine atom and a bromine atom, an alkoxy group such as a methoxy group, a ethoxy group, a propoxy group, and a butoxy group, an alkyloxycarbonyl group, and the like.

 (x-1)

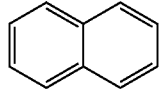 (x-2)

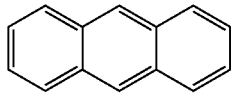 (x-3)

In the polymer (A), the repeating unit (1) may be a repeating unit represented by the following general formula (1-1) (hereinafter referred to as "repeating unit (1-1)").

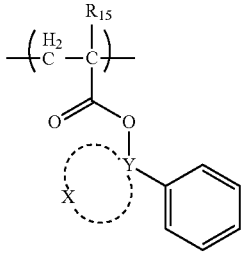 (1-1)

(In the general formula (1-1), $R_{15}$ represents a hydrogen atom, a methyl group, a fluorine atom, or a trifluoromethyl group, X represents an atomic group that forms an alicyclic hydrocarbon group together with Y, and Y represents a carbon atom.)

The description given above in connection with the alicyclic hydrocarbon group formed by X together with Y in the general formula (1) may be applied to the alicyclic hydrocarbon group formed by X together with Y in the general formula (1-1).

The repeating unit (1) can be obtained using a compound represented by the following general formula (m-1) as a monomer, for example.

(m-1)

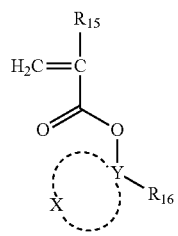

(In the general formula (m-1), $R_{15}$ represents a hydrogen atom, a methyl group, a fluorine atom, or a trifluoromethyl group, $R_{16}$ represents a substituted or unsubstituted aryl group having 6 to 22 carbon atoms, X represents an atomic group that forms an alicyclic hydrocarbon group together with Y, and Y represents a carbon atom.)

$R_{15}$, $R_{16}$, X, and Y in the general formula (m-1) are the same as defined for $R_{15}$, $R_{16}$, X, and Y in the general formula (1).

Note that the polymer (A) may include only one type of repeating unit (1), or may include two or more types of repeating unit (1).

The polymer (A) may further include at least one of a repeating unit represented by the following general formula (2) (hereinafter referred to as "repeating unit (2)"), a repeating unit represented by the following general formula (3) (hereinafter referred to as "repeating unit (3)"), a repeating unit represented by the following general formula (4) (hereinafter referred to as "repeating unit (4)"), and a repeating unit represented by the following general formula (5) (hereinafter referred to as "repeating unit (5)").

(2)

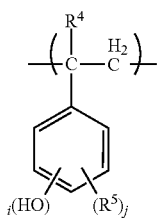

(In the general formula (2), $R^4$ represents a hydrogen atom or a methyl group, $R^5$ represents a hydrogen atom or a monovalent organic group, i is an integer from 1 to 3, and j is an integer from 0 to 3, provided that "i+j≤5" is satisfied.)

(3)

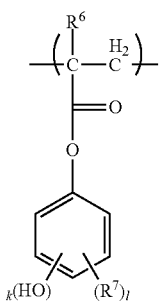

(In the general formula (3), $R^6$ represents a hydrogen atom or a methyl group, $R^7$ represents a hydrogen atom or a monovalent organic group, k is an integer from 1 to 3, and l is an integer from 0 to 3, provided that "k+l≤5" is satisfied.)

(4)

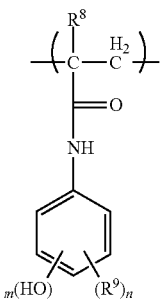

(In the general formula (4), $R^8$ represents a hydrogen atom or a methyl group, $R^9$ represents a hydrogen atom or a monovalent organic group, m is an integer from 1 to 3, and n is an integer from 0 to 3, provided that "m+n≤5" is satisfied.)

(5)

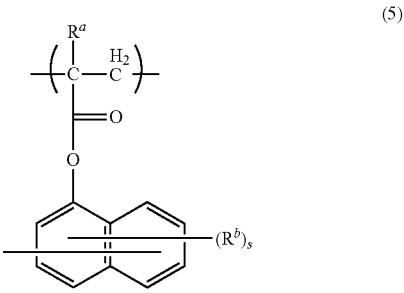

(In the general formula (5), $R^a$ represents a hydrogen atom or a methyl group, $R^b$ represents a monovalent organic group, r is an integer from 1 to 3, and s is an integer from 0 to 3.)

Examples of the monovalent organic group for $R^5$ in the general formula (2) include a linear or branched alkyl group having 1 to 12 carbon atoms such as a methyl group, an ethyl group, a n-propyl group, an i-propyl group, a n-butyl group, a 2-methylpropyl group, a 1-methylpropyl group and a t-butyl group; a linear or branched alkoxyl group having 1 to 12 carbon atoms such as a methoxy group, an ethoxy group, a n-propoxy group, an i-propoxy group, a n-butoxy group, a 2-methylpropoxy group, a 1-methylpropoxy group and a t-butoxy group; a cycloalkyl group such as a cyclopentyl group, a cyclohexyl group, a cycloheptyl group, a cyclooctyl group, a cyclodecanyl group and a cyclododecanyl group: an adamantyl group, a noradamantyl group, a decalin residue (decalinyl group), a tricyclodecanyl group, a tetracyclododecanyl group, a norbornyl group, a cedrol group, and the like. Among these, a methyl group, an ethyl group, a n-butyl group and a t-butyl group are preferable.

In the general formula (2), i is an integer from 1 to 3, and more preferably 1 or 2.

In the general formula (2), j is an integer from 0 to 3, and more preferably 0 to 2.

Specific examples of the repeating unit (2) represented by the general formula (2) include repeating units represented by the following formulae (2-1) to (2-4), and the like.

Note that the polymer (A) may include only one type of repeating unit (2), or may include two or more types of repeating unit (2).

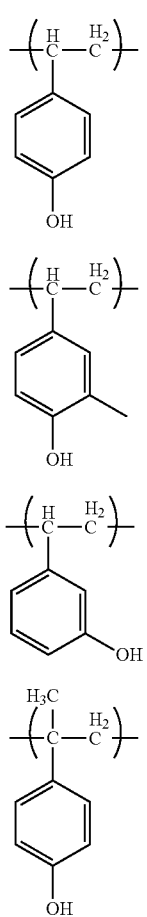

(2-1)

(2-2)

(2-3)

(2-4)

The description given above in connection with the monovalent organic group represented by $R^5$ in the general formula (2) may be applied to the monovalent organic group represented by $R^7$ in the general formula (3).

In the general formula (3), k is an integer from 1 to 3, and more preferably 1 or 2.

In the general formula (3), l is an integer from 0 to 3, and more preferably 0 or 1.

Specific examples of the repeating unit (3) represented by the general formula (3) include repeating units represented by the following formulae (3-1) and (3-2), and the like.

Note that the polymer (A) may include only one type of repeating unit (3), or may include two or more types of repeating unit (3).

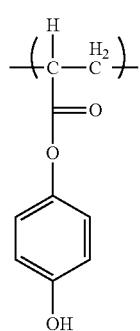

(3-1)

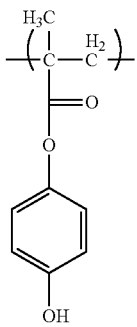

(3-2)

The description given above in connection with the monovalent organic group represented by $R^5$ in the general formula (2) may be applied to the monovalent organic group represented by $R^9$ in the general formula (4).

In the general formula (4), m is an integer from 1 to 3, and more preferably 1 or 2.

In the general formula (4), n is an integer from 0 to 3, and more preferably 0 or 1.

Specific examples of the repeating unit (4) represented by the general formula (4) include repeating units represented by the following formulae (4-1) and (4-2), and the like.

Note that the polymer (A) may include only one type of repeating unit (4), or may include two or more types of repeating unit (4).

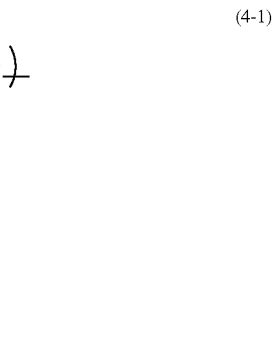

(4-1)

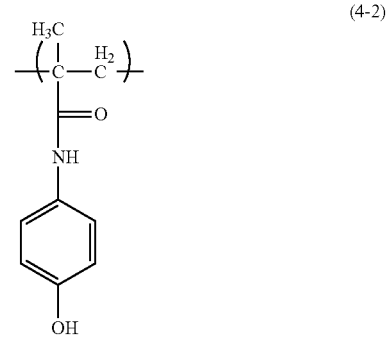

(4-2)

The description given above in connection with the monovalent organic group represented by $R^5$ in the general formula (2) may be applied to the monovalent organic group represented by $R^6$ in the general formula (5).

In the general formula (5), r is an integer from 1 to 3, and more preferably 1 or 2.

In the general formula (5), s is an integer from 0 to 3, and more preferably 0 or 1.

Specific examples of the repeating unit (5) represented by the general formula (5) include repeating units represented by the following formulae (5-1) and (5-2), and the like.

Note that the polymer (A) may include only one type of repeating unit (5), or may include two or more types of repeating unit (5).

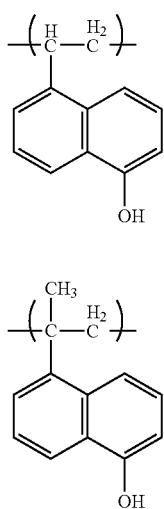

The repeating units represented by the formulae (2-1) to (2-3) can be obtained using the corresponding hydroxystyrene derivative as a monomer. The repeating units represented by the formulae (2-1) to (2-3) may also be obtained using a compound leading to a hydroxystyrene derivative via hydrolysis as a monomer.

The monomers used to form the repeating units represented by the formulae (2-1) to (2-3) are preferably p-acetoxystyrene, p-(1-ethoxyethoxy)styrene, or the like. When using these monomers, the repeating units represented by the formulae (2-1) to (2-3) can be produced by polymerizing the monomers, and hydrolyzing the side chain of the resulting polymer.

The repeating units represented by the formulae (2-4), (3-1), (3-2), (4-1), (4-2), (5-1), and (5-2) can be obtained using the corresponding monomers.

The monomers used to form the repeating units represented by the formulae (2-4), (3-1), (3-2), (4-1), (4-2), (5-1), and (5-2) are preferably p-isopropenylphenol, 4-hydroxyphenyl acrylate, 4-hydroxyphenyl methacrylate, N-(4-hydroxyphenyl)acrylamide, N-(4-hydroxyphenyl)methacrylamide, 5-hydroxynaphthalen-1-yl methacrylate, 5-hydroxynaphthalen-1-yl acrylate, or the like.

The polymer (A) may further include a repeating unit derived from a non-acid-labile compound (hereinafter may be referred to as "repeating unit (6)") and a repeating unit derived from an acid-labile compound (hereinafter may be referred to as "repeating unit (7)") other than the repeating units (I), (II), and (1) to (5).

Examples of the non-acid-labile compound include styrene, α-methylstyrene, 4-methylstyrene, 2-methylstyrene, 3-methylstyrene, isobornyl acrylate, tricyclodecanyl (meth) acrylate, tetracyclododecenyl (meth)acrylate, compounds represented by the following formulae (b-1) to (b-4), and the like. Among these, styrene, α-methylstyrene, 4-methylstyrene, 2-methylstyrene, 3-methylstyrene, tricyclodecanyl (meth)acrylate, the compound represented by the following formula (b-1), the compound represented by the following formula (b-2), the compound represented by the following formula (b-3), and the compound represented by the following formula (b-4) are preferred.

Note that the polymer (A) may include only one type of repeating unit (6), or may include two or more types of repeating unit (6) when the polymer (A) includes the repeating unit (6).

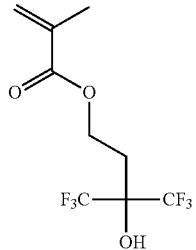

Examples of the repeating unit (7) include structural units represented by the following general formulae (c-1) and (c-2). Among these, the structural unit represented by the general formula (c-1) is preferable.

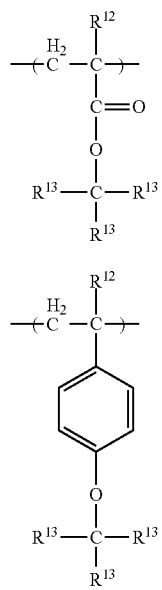

(c-1)

(c-2)

(In the general formulae (c-1) and (c-2), $R^{12}$ independently represents a hydrogen atom, a methyl group, a trifluoromethyl group, or a hydroxymethyl group, and $R^{13}$ independently represent a linear or branched alkyl group having 1 to 4 carbon atoms, a monovalent alicyclic hydrocarbon group having 4 to 20 carbon atoms, a group derived therefrom, or a substituted or unsubstituted aryl group having 6 to 22 carbon atoms, or two of $R^{13}$ bond to each other to form a divalent alicyclic hydrocarbon group having 4 to 20 carbon atoms, or a group derived therefrom, together with a carbon atom that is bonded thereto, and remaining $R^{13}$ represents a linear or branched alkyl group having 1 to 4 carbon atoms, a monovalent alicyclic hydrocarbon group having 4 to 20 carbon atoms, a group derived therefrom, or a substituted or unsubstituted aryl group having 6 to 22 carbon atoms.)

In the general formulae (c-1) and (c-2), examples of the linear or branched alkyl group having 1 to 4 carbon atoms for $R^{13}$ include a methyl group, an ethyl group, a n-propyl group, an i-propyl group, a n-butyl group, a 2-methylpropyl group, a 1-methyl propyl group, a t-butyl group, and the like.

In the general formulae (c-1) and (c-2), examples of the monovalent alicyclic hydrocarbon group having 4 to 20 carbon atoms include a group containing an alicyclic ring derived from norbornane, tricyclodecane, tetracyclododecane, adamantane, a cycloalkane such as cyclobutane, cyclopentane, cyclohexane, cycloheptane and cyclooctane, and the like.

Examples of the group containing an alicyclic ring include a group obtained by substituting the above-mentioned monovalent alicyclic hydrocarbon group with at least one of a linear, branced and cyclic hydrocarbon group having 1 to 4 carbon atoms such as a methyl group, an ethyl group, a n-propyl group, an i-propyl group, a n-butyl group, a 2-methylpropyl group, a 1-methyl propyl group, and a t-butyl group.

Among these, the alicyclic hydrocarbon group for $R^{13}$ is preferably a group containing an alicyclic ring derived from norbornane, tricyclodecane, tetracyclododecane, adamantane, cyclopentane or cyclohexane, a group obtained by substituting the group having an alicyclic ring with an alkyl group, or the like.

In the general formulae (c-1) and (c-2), examples of the aryl group having 6 to 22 carbon atoms include a phenyl group, a 1-naphthyl group, a 2-naphthyl group, a 1-anthryl group, a 1-phenanthryl group, and the like.

Note that one or more hydrogen atoms of the aryl group may be substituted with a substituent. Specific examples of the substituent include a halogen atom such as fluorine atom, chlorine atom, and bromine atom, a phenyl group, an acetoxy group, an alkyl group, an alkoxy group, and the like.

In the general formulae (c-1) and (c-2), examples of the divalent alicyclic hydrocarbon group having 4 to 20 carbon atoms that is formed by bonding two of $R^{13}$ together with a carbon atom that is bonded thereto (i.e., the carbon atom bonded to the oxygen atom) include a cyclobutylene group, a cyclopentylene group, a cyclohexylene group, a cyclooctylene and the like.

Examples of a group derived from the divalent alicyclic hydrocarbon group formed by two of $R^{13}$ include a group obtained by substituting the divalent alicyclic hydrocarbon group with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group, and the like.

Among these, a cyclopentylene group, cyclohexylene group, a group obtained by substituting the divalent alicyclic hydrocarbon group with the above-mentioned alkyl group, and the like are preferable.

Specific examples of a preferable repeating unit (7) include repeating units represented by the following general formulae (7-1) to (7-8), and the like.

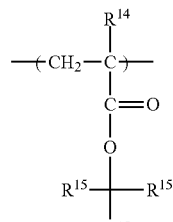

(7-1)

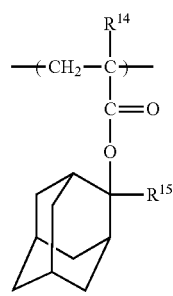

(7-2)

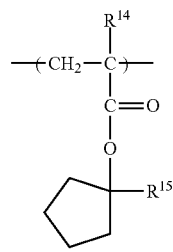

(7-3)

-continued (7-4) 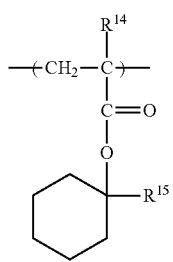

(7-5) 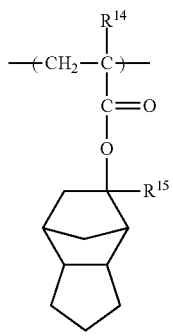

(7-6) 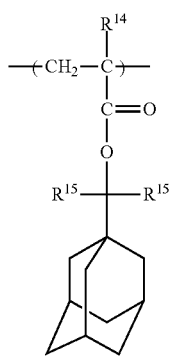

(7-7) 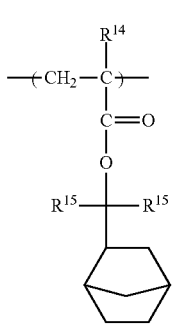

(7-8) 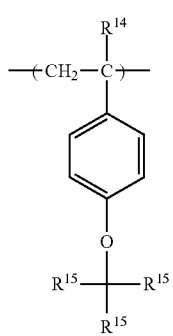

(In the general formulae (7-1) to (7-8), $R^{14}$ independently represents a hydrogen atom, a methyl group, a trifluoromethyl group, or a hydroxymethyl group, and $R^{15}$ independently represent a linear or branched alkyl group having 1 to 4 carbon atoms.)

Note that the polymer (A) may include only one type of repeating unit (7), or may include two or more types of repeating unit (7) when the polymer (A) contains the repeating unit (7).

The repeating unit (7) can be obtained using a compound represented by the following general formula (c-1-m) or (c-2-m) as a monomer, for example.

(c-1-m) 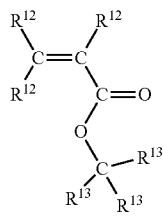

(c-2-m) 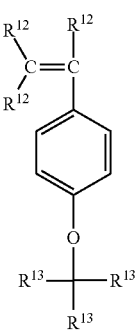

Note that $R^{12}$ and $R^{13}$ in the general formulae (c-1-m) and (c-2-m) are the same as defined for $R^{12}$ and $R^{13}$ in the general formulae (c-1) and (c-2).

The total content of the repeating units (I) and (II) in the polymer (A) is preferably 1% or more by mol, more preferably in the range from 1% to 45% by mol, and further preferably from 2% to 30% by mol based on 100% by mol of the total amount of the repeating units included in the polymer (A). When the total content is 1% or more by mol, excellent sensitivity, high resolution, and a low degree of nano-edge roughness can be achieved, being favorable.

The content of the repeating unit (1) in the polymer (A) is preferably 1% or more by mol, more preferably in the range from 5% to 80% by mol, and further preferably from 10% to 50% by mol based on 100% by mol of the total amount of the repeating units included in the polymer (A). When the content of the repeating unit (1) is 1% or more by mol, a radiation-sensitive resin composition including the polymer (A) as an acid-labile group-containing polymer leads to a low degree of nano-edge roughness.

The content of the repeating unit (6) in the polymer (A) is normally 80% or less by mol, and preferably in the range from 0% to 60% by mol based on 100% by mol of the total amount of the repeating units included in the polymer (A). When the content of the repeating unit (6) is 80% or less by mol, a radiation-sensitive resin composition including the polymer (A) as an acid-labile group-containing polymer leads to an excellent balance between resolution and nano-edge roughness.

The content of the repeating unit (7) in the polymer (A) is normally 60% or less by mol, and preferably in the range from 0% to 50% by mol based on 100% by mol of the total amount of the repeating units included in the polymer (A). When the content of the repeating unit (7) is 60% or less by mol, a radiation-sensitive resin composition including the polymer (A) as an acid-labile group-containing polymer leads to an excellent balance between resolution and nano-edge roughness.

The total content of the repeating units (6) and (7) in the polymer (A) is 90% or less by mol, and preferably in the range from 0% to 80% by mol based on 100% by mol of the total amount of the repeating units included in the polymer (A). When the total content is 90% or less by mol, a radiation-sensitive resin composition containing the polymer (A) as an acid-labile group-containing polymer leads to an excellent balance between resolution and nano-edge roughness.

The synthesizing method of the polymer (A) according to one embodiment of the invention is not particularly limited. For example, the polymer (A) may be synthesized by a known radical polymerization. The side-chain hydroxystyrene unit of the additional repeating unit may be obtained by hydrolyzing the polymer (A) (e.g., acetoxy group) in an organic solvent in the presence of a base or an acid.

The polymer (A) may be synthesized by radical polymerization by stirring and heating the monomers such as the compound (I-m) or (II-m) in an appropriate organic solvent under a nitrogen atmosphere in the presence of a radical initiator, for example.

Examples of the radical initiator include an azo compound such as 2,2'-azobisisobutylonitrile, 2,2'-azobis(2,4-dimethylvaleronitrile), 2,2'-azobis(4-methoxy-2,4-dimethylvaleronitrile), 2,2'-azobismethylbutyronitrile, 2,2'-azobiscyclohexanecarbonitrile, cyanomethylethylazoformamide, 2,2'-azobis(methyl 2,4-dimethylpropanate) and 2,2'-azobiscyanovaleric acid; an organic peroxide such as benzoyl peroxide, lauroyl peroxide, 1,1'-bis(t-butylperoxy)cyclohexane, 3,5,5-trimethylhexanoyl peroxide and t-butyl peroxy-2-ethylhexanoate; hydrogen peroxide; and the like.

A polymerization promoter such as 2,2,6,6-tetramethyl-1-piperidinyloxy, iodine, a mercaptan, or a styrene dimer may optionally be used for radical polymerization.

The radical polymerization temperature is appropriately selected (e.g., 50 to 200° C.) depending on the type of initiator, and the like. When using an azo initiator or a peroxide initiator, the radical polymerization temperature is preferably determined so that the half-life of the initiator is about 10 minutes to about 30 hours (more preferably about 30 minutes to about 10 hours).

The reaction time is determined depending on the type of initiator and the reaction temperature, but is preferably determined so that 50% or more of the initiator is consumed (generally about 0.5 hours to about 24 hours).

Note that the polymer (A) may be synthesized by heating the monomers without using the initiator.

Examples of an acid used when introducing a hydroxystyrene unit by hydrolyzing the side chain of the polymer (A) include organic acids such as p-toluenesulfonic acid, a hydrate thereof, methanesulfonic acid, trifluoromethanesulfonic acid, malonic acid, oxalic acid, and 1,1,1-fluoroacetic acid; inorganic acids such as sulfuric acid, hydrochloric acid, phosphoric acid, and hydrobromic acid; salts such as pyridinium p-toluenesulfonate, ammonium p-toluenesulfonate, and 4-methylpyridinium p-toluenesulfonate; and the like.

Examples of a base include inorganic bases such as potassium hydroxide, sodium hydroxide, sodium carbonate, and potassium carbonate; organic bases such as triethylamine, N-methyl-2-pyrrolidone, piperidine, and tetramethylammonium hydroxide; and the like.

Examples of the organic solvent used for polymerization or hydrolysis include a ketone such as acetone, methyl ethyl ketone, and methyl amyl ketone; an ether such as diethyl ether and tetrahydrofurane (THF); an alcohol such as methanol, ethanol and propanol; an aliphatic hydrocarbon such as hexane, heptane and octane; an aromatic hydrocarbon such as benzene, toluene and xylene; an alkyl halide such as chloroform, bromoform, methylene chloride, methylene bromide and carbon tetrachloride; an ester such as ethyl acetate, butyl acetate, ethyl lactate, propylene glycol monomethyl ether, propylene glycol monomethyl ether acetate and cellosolve; an aprotic polar solvent such as dimethylformamide, dimethyl sulfoxide, and hexamethylphosphoroamide; and the like.

Among these, acetone, methyl amyl ketone, methyl ethyl ketone, tetrahydrofurane, methanol, ethanol, propanol, ethyl acetate, butyl acetate, ethyl lactate, propylene glycol monomethyl ether, propylene glycol monomethyl ether acetate and the like are preferable.

The polystyrene-reduced weight average molecular weight (hereinafter may be referred to as "Mw") of the polymer (A) determined by gel permeation chromatography (GPC) is preferably in the range from 1,000 to 100,000, more preferably from 2,000 to 40,000, and further preferably from 2,000 to 25,000.

The ratio Mw/Mn of Mw and polystyrene-reduced number average molecular weight (hereinafter may be referred to as "Mn") of the polymer (A) determined by GPC is normally in the range from 1 to 5, preferably from 1 to 4, and further preferably from 1 to 3.

The radiation-sensitive resin composition according to one embodiment of the invention exhibits excellent sensitivity due to the novel sulfonate-containing polymer (i.e., polymer (A)). The radiation-sensitive resin composition can thus form a chemically-amplified positive-tone resist film that effectively responds to (extreme) deep ultraviolet rays (e.g., KrF excimer laser light, ArF excimer laser light, or EUV light), X-rays such as synchrotron radiation, or electron beams during a lithographic process, exhibits a low degree of roughness, excellent sensitivity, and excellent resolution, and can stably and accurately form a fine pattern.

1-2. Acid Diffusion Controller

The radiation-sensitive resin composition according to one embodiment of the invention preferably further includes an acid diffusion controller (hereinafter may be referred to as "acid diffusion controller (B)") in addition to the polymer (A).

The acid diffusion controller (B) controls a phenomenon in which an acid generated by the polymer (A) upon exposure is diffused in a resist film, and suppresses undesired chemical reactions in the unexposed area.

The acid diffusion controller (B) improves the storage stability of the resulting radiation-sensitive resin composition, and sufficiently improves the resolution of the resulting resist film. Moreover, the acid diffusion controller (B) suppresses a change in line width of the resist pattern due to a change in post-exposure delay (PED) from exposure to post-exposure bake, so that a radiation-sensitive resin composition that exhibits remarkably superior process stability can be obtained.

A nitrogen-containing organic compound, a photosensitive basic compound (photodegradable basic compound), or the like is preferably used as the acid diffusion controller (B). Among these, a photosensitive basic compound is preferably used.

Examples of the nitrogen-containing organic compound include a compound represented by the following general formula (i) (hereinafter referred to as "nitrogen-containing compound (i)"), a compound having two nitrogen atoms in one molecule (hereinafter referred to as "nitrogen-containing compound (ii)"), a polyamino compound or a polymer having three or more nitrogen atoms (hereinafter collectively referred to as "nitrogen-containing compound (iii)"), an amide group-containing compound, a urea compound, a nitrogen-containing heterocyclic compound, and the like.

(i)

(In the general formula (i), $R_{17}$ independently represent a hydrogen atom, a substituted or unsubstituted linear, branched or cyclic alkyl group, a substituted or unsubstituted aryl group, or a substituted or unsubstituted aralkyl group.

Examples of the preferable nitrogen-containing compound (i) include a mono(cyclo)alkylamine, a di(cyclo)alkylamine, a tri(cyclo)alkylamine, a substituted alkylamine, and an aromatic amine.

Examples of the preferable nitrogen-containing compound (ii) include ethylene diamine, N,N,N',N'-tetramethyl ethylene diamine, tetramethylene diamine, hexamethylene diamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylene diamine, N,N,N',N'',N''-pentamethyldiethylene triamine, and the like.

Examples of the preferable nitrogen-containing compound (iii) include polyethyleneimine, polyallylamine, poly(2-dimethylaminoethylacrylamide), and the like.

Examples of the preferable amide group-containing compound include a N-t-butoxycarbonyl group-containing amino compound such as N-t-butoxycarbonyl-di-n-octylamine, N-t-butoxycarbonyl-di-n-nonylamine, N-t-butoxycarbonyl-di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methyl formamide, N,N-dimethyl formamide, acetamide, N-methyl acetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the preferable urea compound include urea, methylurea, 1,1-dimethylurea, 1,3-dimethylurea, 1,1,3,3-tetramethylurea, 1,3-diphenylurea, tri-n-butylthiourea, and the like.

Examples of the preferable nitrogen-containing heterocyclic compound include imidazoles, pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetyl morpholine, 3-(N-morpholino)-1,2-propane diol, 1,4-dimethylpiperazine, 1,4-diazabicyclo[2,2,2]octane, and the like.

The photosensitive basic compound (photodegradable basic compound) is decomposed and loses basicity in an exposed area, but remains undecomposed in an unexposed area. The photosensitive basic compound can effectively utilize an acid generated in an exposed area, and can thus improve nano-edge roughness and resolution as compared with a non-photosensitive basic compound.

The photosensitive basic compound is not particularly limited as long as the photosensitive basic compound has the above properties. Specifically compounds represented by the following general formulae (B1) and (B2), and the like are preferable examples. The compound represented by the general formula (B1) is particularly preferable as the photosensitive basic compound.

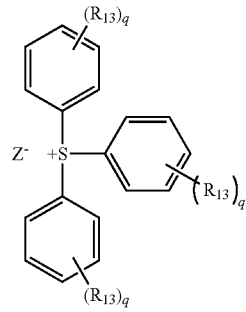

(B1)

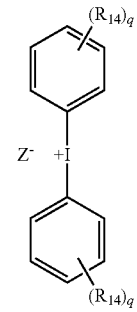

(B2)

(In the general formulae (B1) and (B2), $R_{13}$ and $R_{14}$ represent a monovalent organic group, $Z^-$ represents $R_{15}O^-$ or $R_{15}COO^-$, $R_{15}$ represents a monovalent organic group, and q are independently an integer from 0 to 5.)

Examples of the monovalent organic group for $R_{13}$ and $R_{14}$ in the general formulae (B1) and (B2) include a hydrogen atom, a halogen atom, a substituted or unsubstituted alkyl group having 1 to 10 carbon atoms, a substituted or unsubstituted alicyclic hydrocarbon group, and the like.

Examples of the substituted or unsubstituted alkyl group having 1 to 10 carbon atoms include a methyl group, an ethyl group, an n-butyl group, a t-butyl group, a trifluoromethyl group, and the like. Note that the alkyl group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the substituted or unsubstituted alicyclic hydrocarbon group include the above-mentioned structures represented by the general formulae (a-1) to (a-50), and the like. Note that the alicyclic hydrocarbon group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the halogen atom include a fluorine atom, a chlorine atom, a bromine atom, an iodine atom, and the like.

$R_{13}$ and $R_{14}$ are preferably a hydrogen atom or a t-butyl group.

Note that a plurality of $R_{13}$ may be either identical or different when a plurality of $R_{13}$ are present in the general formula (B1). Likewise, a plurality of $R_{14}$ may be either identical or different when a plurality of $R_{14}$ are present in the general formula (B2).

$Z^-$ in the general formulae (B1) and (B2) represent $R_{15}O^-$ or $R_{15}COO^-$.

Examples of the monovalent organic group for $R_{15}$ include a substituted or unsubstituted alkyl group and a substituted or unsubstituted aryl group.

$Z^-$ is preferably $CH_3COO^-$ or any of the compounds represented by the following formulae (Z-1) to (Z-4).

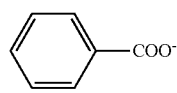

(Z-1)

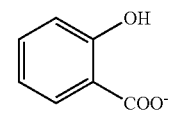

(Z-2)

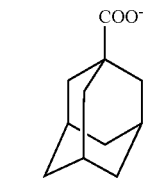

(Z-3)

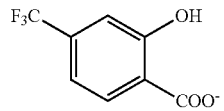

(Z-4)

Specific examples of the photosensitive basic compound include a triphenylsulfonium compound (i.e., the above-mentioned compound represented by the general formula (1)) wherein the anion moiety ($Z^-$) is $CH_3COO^-$ or the compound represented by the formula (Z-2) or (Z-3), and the like.

The acid diffusion controller (B) may be used singly or in combination of two or more types thereof.

The acid diffusion controller (B) is used in an amount of preferably 15 parts or less by mass, more preferably in the range from 0.001 to 10 parts by mass, and further preferably from 0.005 to 5 parts by mass based on 100 parts by mass of the polymer (A). If the amount of the acid diffusion controller (B) exceeds 15 parts by mass, the sensitivity of the resulting resist film or the developability of the exposed area may deteriorate. Note that the pattern shape or the dimensional accuracy of the resulting resist film may deteriorate depending on the process conditions if the amount of the acid diffusion controller (B) is less than 0.001 parts by mass.

1-3. Photoacid Generator

The radiation-sensitive resin composition according to one embodiment of the invention may include an additional acid generator compound that is decomposed to generate an acid upon exposure to active rays or radiation, in addition to the polymer (A).

The molar ratio of the total content of the repeating units (I) and (II) in the polymer (A) to the content of the additional acid generator compound is in the range from 100/0 to 20/80, preferably from 100/0 to 40/60, and further preferably from 100/0 to 50/50.

A cationic photoinitiator, a radical photoinitiator, a photodecolorizer (e.g., dye), a photoalterant (discoloring agent), a known compound capable of generating an acid upon exposure to light that is used for a micro resist, or a mixture thereof may be appropriately used as the additional acid generator.

An onium salt compound may effectively be used as the additional acid generator compound that is decomposed to generate an acid upon exposure to active rays or radiation.

Examples of the onium salt compound include a sulfonium salt such as a tetrahydrothiophenium salt; an iodonium salt; a phosphonium salt; a diazonium salt; a pyridinium salt; and the like. These onium salt compounds may be used singly or in combination of two or more types thereof.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylphosphonium 1,1,2,2-tetrafluoro-6-(1-adamantanecarbonyloxy)-hexane-1-sulfonate, and the like.

Among these, triphenylsulfonium trifluoromethanesulfonate, triphenylsulfonium nonafluoro-n-butanesulfonate and triphenylphosphonium 1,1,2,2-tetrafluoro-6-(1-adamantanecarbonyloxy)-hexane-1-sulfonate are preferable.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium2-bicyclo [2.2.1]hept-2-yl-1,1,2,2-tetrafluoroethanesulfonate, 1-(3,5-dimethyl-4-hydroxyphenyl)tetrahydrothiophenium camphorsulfonate, and the like. Among these, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate and 1-(3,5-dimethyl-4-hydroxyphenyl)tetrahydrothiophenium nonafluoro-n-butanesulfonate, are preferable.

Examples of the iodonium salt include diphenyliodonium trifluoromethanesulfonate, diphenyliodonium nona fluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like. Among these, bis(4-t-butylphenyl)iodonium nonafluoro-n-butanesulfonate, is preferable.

Examples of the preferable onium salt compound include an iodonium salt represented by the following general formula (PAG3) and a sulfonium salt represented by the following general formula (PAG4).

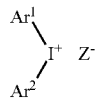

(PAG3)

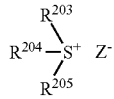

(PAG4)

In the above formula, $Ar^1$ and $Ar^2$ independently represent a substituted or unsubstituted aryl group. Examples of the preferable substituent include an alkyl group, a haloalkyl group, a cycloalkyl group, an aryl group, an alkoxy group, a nitro group, a carboxyl group, an alkoxycarbonyl group, a hydroxyl group, a mercapto group, and a halogen atom.

$R^{203}$, $R^{204}$ and $R^{205}$ independently represent a substituted or unsubstituted alkyl group or a substituted or unsubstituted aryl group. $R^{203}$, $R^{204}$, and $R^{205}$ are preferably an aryl group having 6 to 14 carbon atoms, an alkyl group having 1 to 8 carbon atoms, or a derivative thereof. Examples of the preferable substituent for the aryl group include an alkoxy group having 1 to 8 carbon atoms, an alkyl group having 1 to 8 carbon atoms, a nitro group, a carboxyl group, a hydroxyl group, and a halogen atom. Examples of the preferable substituent for the alkyl group include an alkoxy group having 1 to 8 carbon atoms, a carboxyl group, and an alkoxycarbonyl group.

$Z^-$ represents a counter anion such as a perfluoroalkanesulfonic acid anion (e.g., $CF_3SO_3^-$) and a pentafluorobenzenesulfonic acid anion.

Note that two of $R^{203}$, $R^{204}$ and $R^{205}$ may be bonded to each other via a single bond or a substituent, and $Ar^1$ and $Ar^2$ may be bonded to each other via a single bond or a substituent.

1-4. Additional Component

The radiation-sensitive resin composition according to one embodiment of the invention may optionally further include a resin having a group capable of increasing solubility in an alkaline developer, an alkali-soluble resin, a low-molecular-weight acid-labile dissolution inhibitor compound, a dye, a pigment, a plasticizer, a surfactant, a photosensitizer, a compound having two or more phenolic OH groups capable of promoting dissolution in a developer, and the like.

1-5. Solvent

Examples of the solvent used for preparing a solution of the radiation-sensitive resin composition (radiation-sensitive resin composition solution) include a linear or branched ketone such as 2-pentanone, 2-hexanone, 2-heptanone and 2-octanone; a cyclic ketone such as cyclopentanone and cyclohexanone; a propylene glycol monoalkyl ether acetate such as propylene glycol monomethyl ether acetate and propylene glycol monoethyl ether acetate; an alkyl 2-hydroxypropionate such as methyl 2-hydroxypropionate and ethyl 2-hydroxypropionate; an alkyl 3-alkoxypropionate such as methyl 3-methoxypropionate, ethyl 3-methoxypropionate, methyl 3-ethoxypropionate and ethyl 3-ethoxypropionate; ethylene glycol monomethyl ether, ethylene glycol monoethyl ether, diethylene glycol dimethyl ether, diethylene glycol diethyl ether, ethylene glycol monomethyl ether acetate, ethylene glycol monoethyl ether acetate, propylene glycol monomethyl ether, propylene glycol monoethyl ether, n-butyl acetate, methyl pyruvate, ethyl pyruvate, N-methylpyrrolidone, γ-butyrolactone; and the like.

Among these, it is preferable to use at least one compound selected from propylene glycol monomethyl ether acetate, propylene glycol monomethyl ether, 2-heptanone, cyclohexanone, γ-butyrolactone, ethyl 2-hydroxypropionate, and ethyl 3-ethoxypropionate.

The solvent may be used singly or in combination of two or more types thereof.

A surfactant may be added to the solvent.

Examples of the surfactant include a nonionic surfactant such as a polyoxyethylene alkyl ether such as polyoxyethylene lauryl ether, polyoxyethylene stearyl ether, polyoxyethylene cetyl ether and polyoxyethylene oleyl ether, a polyoxyethylene alkyl aryl ether such as polyoxyethylene octyl phenyl ether and polyoxyethylene nonyl phenyl ether; a polyoxyethylene-polyoxypropylene block copolymer; a sorbitan fatty acid ester such as sorbitan monolaurate, sorbitan monopalmitate, sorbitan monostearate, sorbitan monooleate, sorbitan trioleate and sorbitan tristearate; a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; a fluorine-based surfactant such as "EFTOP EF301", "EFTOP EF303", and "EFTOP EF352" (manufactured by Mitsubishi Materials Electronic Chemicals Co., Ltd.), "Megafac F171", and "Megafac F173" (manufactured by DIC Corporation), "Fluorad FC430", and "Fluorad FC431" (manufactured by Sumitomo 3M Ltd.), "Asahi Guard AG710", "Surflon S-382", "Surflon SC101", "Surflon SC102", "Surflon SC103", "Surflon SC104", "Surflon SC105", and "Surflon SC106" (manufactured by Asahi Glass Co., Ltd.); "KP341" (organosiloxane polymer) (manufactured by Shin-Etsu Chemical Co., Ltd.), "Polyflow No. 75", and "Polyflow No. 95" (methacrylic acid (co)polymer) (manufactured by Kyoeisha Chemical Co., Ltd.), and the like.

The surfactant is used in an amount of normally 2 parts or less by mass, and preferably 1 part or less by mass based on 100 parts by mass of the solid contained in the radiation-sensitive resin composition according to one embodiment of the invention.

The surfactant may be used singly or in combination of two or more types thereof The solvent is preferably used so that the total solid content of the radiation-sensitive resin composition according to one embodiment of the invention is in the range from 1% to 20% by mass, more preferably from 1% to 15% by mass, and further preferably 1% to 10% by mass.

The radiation-sensitive resin composition according to one embodiment of the invention can be prepared by mixing the polymer (A) and the solvent. More specifically, the radiation-sensitive resin composition can be prepared by homogeneously dissolving the polymer (A) and an optional component in the solvent so that the total solid content is within the above range. The radiation-sensitive resin composition thus prepared is preferably filtered through a filter having a pore size of about 0.2 μm, for example.

2. Radiation-Sensitive Resin Composition (ii)

The radiation-sensitive resin composition (ii) according to another embodiment of the invention is characterized by containing a specific polymer, a specific cation, and a solvent.

2-1. Polymer (A2)

The radiation-sensitive resin composition according to another embodiment of the invention includes a polymer having at least one of a repeating unit represented by the following general formula (I-a) and a repeating unit represented by the following general formula (II-a) (hereinafter may be referred to as "polymer (A2)") as a polymer component.

The polymer (A2) is insoluble or scarcely soluble in an alkali, but becomes readily soluble in an alkali due to an acid.

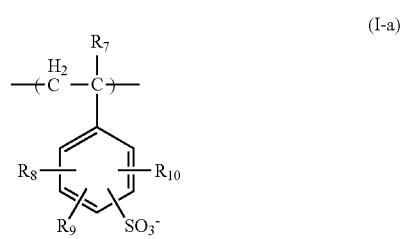

(I-a)

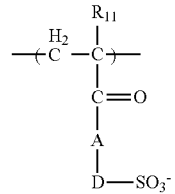

(II-a)

(In the general formulae (I-a) and (II-a), $R_7$ and $R_{11}$ independently represent a hydrogen atom, a halogen atom, a cyano group, or a substituted or unsubstituted alkyl group, $R_8$ to $R_{10}$ independently represent a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —$NR_{12}$— (wherein $R_{12}$ represents a hydrogen atom, a substituted or unsubstituted alkyl group, or a substituted or unsubstituted aryl group), and D represents a substituted or unsubstituted methylene group, a substituted or unsubstituted alkylene group, or a substituted or unsubstituted arylene group.)

In the general formulae (I-a) and (II-a), $R_7$ to $R_{11}$, A, and D are the same as defined for $R_7$ to $R_{11}$, A, and D in the general formulae (I) and (II) mentioned above in connection with the radiation-sensitive resin composition (i).

The polymer (A2) may further include one or more types of repeating units among the repeating units (1) to (7) mentioned above in connection with the radiation-sensitive resin composition (i).

It is preferable that the polymer (A2) include the acid-labile group-containing structural unit (repeating unit (7)).

The total content of the repeating unit represented by the general formula (I-a) and the repeating unit represented by the general formula (II-a) in the polymer (A2) is preferably 1% or more by mol, more preferably in the range from 1% to 45% by mol, and further preferably from 2% to 30% by mol based on 100% by mol of the total of the repeating units included in the polymer (A2). When the total content of the repeating units is 1% or more by mol, excellent sensitivity, high resolution, and a low degree of nano-edge roughness can be achieved, being favorable.

The content of the repeating unit (1) in the polymer (A2) according to the embodiment of the invention is preferably 1% or more by mol, more preferably in the range from 5% to 80% by mol, and further preferably from 10% to 50% by mol based on 100% by mol of the total amount of the repeating units included in the polymer (A2). When the content of the repeating unit (1) is 1% or more by mol, a low degree of nano-edge roughness can be achieved.

The content of the repeating unit (6) in the polymer (A2) is normally 80% or less by mol, and preferably in the range from 0% to 60% by mol based on 100% by mol of the total amount of the repeating units included in the polymer (A2). When the content of the repeating unit (6) is 80% or less by mol, a radiation-sensitive resin composition leads to an excellent balance between resolution and nano-edge roughness.

The content of the repeating unit (7) in the polymer (A2) is normally 60% or less by mol, and preferably in the range from 0% to 50% by mol based on 100% by mol of the total amount of the repeating units included in the polymer (A2). When the content of the repeating unit (7) is 60% or less by mol, a radiation-sensitive resin composition leads to an excellent balance between resolution and nano-edge roughness.

The total content of the repeating units (6) and (7) in the polymer (A2) is 90% or less by mol, and preferably in the range from 0% to 80% by mol based on 100% by mol of the total amount of the repeating units included in the polymer (A2). When the total content is 90% or less by mol, a radiation-sensitive resin composition leads to an excellent balance between resolution and nano-edge roughness.

The synthesizing method of the polymer (A2) according to the embodiment of the present invention is not particularly limited. For example, the polymer (A2) may be synthesized by a known radical polymerization. The side-chain hydroxystyrene unit of the additional repeating unit may be obtained by hydrolyzing the polymer (A2) (e.g., acetoxy group) in an organic solvent in the presence of a base or an acid.

The polymer (A2) may be synthesized by radical polymerization by stirring and heating the desired monomers in an appropriate organic solvent under a nitrogen atmosphere in the presence of a radical initiator, for example. Note that the polymer (A2) may be synthesized by heating the monomers without using the initiator.

The polystyrene-reduced weight average molecular weight (hereinafter may be referred to as "Mw") of the polymer (A2) determined by gel permeation chromatography (GPC) is preferably in the range from 1,000 to 100,000, more preferably from 2,000 to 40,000, and further preferably from 2,000 to 25,000.

The ratio Mw/Mn of Mw and polystyrene-reduced number average molecular weight (hereinafter may be referred to as "Mn") of the polymer (A2) determined by GPC is normally in the range from 1 to 5, preferably from 1 to 4, and further preferably from 1 to 3.

2-2. Cation

The radiation-sensitive resin composition according to another embodiment of the invention includes a cation represented by the following general formula (III).

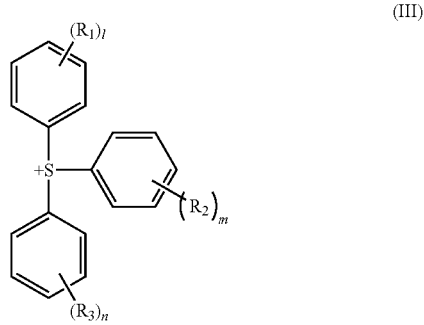

(In the general formula (III), $R_1$ to $R_3$ independently represent a hydroxyl group, a halogen atom, a substituted or unsubstituted alkyl group, a substituted or unsubstituted cycloalkyl group, a substituted or unsubstituted alkoxy group, —S—$R_6$ (wherein $R_6$ represents a substituted or unsubstituted alkyl group or a substituted or unsubstituted aryl group), or a group having two or more heteroatoms, provided that at least one $R^1$ represents a group having two or more heteroatoms, l is an integer from 1 to 5, and m and n are independently an integer from 0 to 5.)

In the general formula (III), $R_1$ to $R_3$, l, m, and n are the same as defined for $R_1$ to $R_3$, l, m, and n in the general formula (I) mentioned above in connection with the radiation-sensitive resin composition (i).

The cation represented by the general formula (III) may be introduced into the radiation-sensitive resin composition (ii) in an arbitrary manner. The cation may be introduced as a polymer having the corresponding anion site, or may be introduced as an acid generator compound having the corresponding anion site.

2-3. Additional Component

The radiation-sensitive resin composition (ii) according to another embodiment of the invention may optionally further include an acid generator, an acid diffusion controller, a resin having a group capable of increasing solubility in an alkaline developer, an alkali-soluble resin, a low-molecular-weight acid-labile dissolution inhibitor compound, a dye, a pigment, a plasticizer, a surfactant, a photosensitizer, a compound having two or more phenolic OH groups capable of promoting dissolution in a developer, and the like.

2-4. Solvent

The description given above in connection with the solvent included in the radiation-sensitive resin composition (i) may be applied to a solvent used to prepare the radiation-sensitive resin composition (ii).

The solvent is preferably used so that the total solid content of the radiation-sensitive resin composition (ii) according to one embodiment of the invention is in the range from 1% to 20% by mass, more preferably from 1% to 15% by mass, and further preferably 1% to 10% by mass.

The radiation-sensitive resin composition according to one embodiment of the invention can be prepared by mixing the polymer (A2), the compound having the cation represented by the general formula (III) and the solvent. More specifically, the radiation-sensitive resin composition can be prepared by homogeneously dissolving the polymer (A2) and an optional component in the solvent so that the total solid content is within the above range. The radiation-sensitive resin composition thus prepared is preferably filtered through a filter having a pore size of about 0.2 μm, for example.

3. Novel Monomer

The monomer of the embodiment of the present invention is represented by the above-mentioned general formula (I-m) or (II-m).

The monomer is suitably used as a monomer for synthesizing the polymer (A) included in the radiation-sensitive resin composition according to one embodiment of the invention.

4. Novel Polymer

The polymer of the embodiment of the present invention is characterized by containing at least one of the repeating unit represented by the general formula (I) and the repeating unit represented by the general formula (II).

The polymer generates a sulfonic acid upon exposure to electron beams, (extreme) deep ultraviolet rays, or the like, and is suitably used as the polymer component included in the radiation-sensitive resin composition according to one embodiment of the invention.

5. Resist Pattern-Forming Method

The radiation-sensitive resin composition of the embodiment of the present invention is useful as a material capable of forming a chemically-amplified positive-tone resist film.

The chemically-amplified positive-tone resist film is designed so that the acid-labile group included in the polymer (A) dissociates due to an acid generated by the polymer (A) upon exposure, so that the polymer (A) becomes alkali-soluble. Specifically, an alkali-soluble area is formed in the resist film. The alkali-soluble area corresponds to the exposed area of the resist. The exposed area can be dissolved and removed using an alkaline developer. A positive-tone resist pattern having a desired shape can thus be formed. The resist pattern-forming method is described in detail below.

When the radiation-sensitive resin composition of the embodiment of the present invention is used to form a resist pattern, a resist film is formed using the radiation-sensitive resin composition of the embodiment of the present invention. The radiation-sensitive resin composition may be filtered through a filter having a pore size of about 0.2 μm after adjusting the total solid content, for example. The radiation-sensitive resin composition is applied to a substrate such as a silicon wafer and aluminum-coated wafer using an appropriate coating method (e.g., rotational coating, cast coating, or roll coating) to form a resist film. The resist film may optionally be pre-baked (PB) at a temperature ranging from about 70° C. to 160° C. The resist film is then exposed so that a desired resist pattern is formed. Examples of radiation for exposure include (extreme) deep ultraviolet rays such as KrF excimer laser light (wavelength: 248 nm), ArF excimer laser light (wavelength: 193 nm), EUV light (extreme ultraviolet rays, wavelength: 13.5 nm), X-rays such as synchrotron radiation, charged particle rays such as electron beams, and the like. The exposure conditions (e.g., dose) may be appropriately selected depending on the composition of the radiation-sensitive resin composition, the type of additive, and the like. Note that liquid immersion lithography may also be used.

The exposed resist film is preferably subjected to post-exposure bake (PEB). PEB ensures smooth dissociation of the acid-labile group included in the polymer (A). The PEB temperature is appropriately selected depending on the composition of the radiation-sensitive resin composition, but is preferably in the range from 30° C. to 200° C., and more preferably from 50° C. to 170° C.

In order to maximize the potential of the radiation-sensitive resin composition, an organic or inorganic antireflective film may be formed on the substrate (see Japanese Examined Patent Publication (KOKOKU) No. 6-12452 (Japanese Patent Application Publication (KOKAI) No. 59-93448), for example). A protective film may be formed on the resist film so that the resist film is not affected by basic impurities and the like contained in the environmental atmosphere (see Japanese Patent Application Publication (KOKAI) No. 5-188598, for example). Note that these techniques may be used in combination.

The exposed resist film is then developed to form a given resist pattern. The developer used for development is preferable to use an alkaline aqueous solution obtained by dissolving at least one alkaline compound of sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, 1,5-diazabicyclo-[4.3.0]-5-nonene, and the like.

The concentration of the alkaline aqueous solution is preferably 10% or less by mass. If the concentration of the alkaline aqueous solution exceeds 10% by mass, the unexposed area may also be dissolved in the developer.

The pH of the developer is preferably in the range from 8 to 14, and more preferably from 9 to 14.

An organic solvent may be added to the alkaline aqueous solution (developer).

Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide, and the like. These organic solvents may be used either individually or in combination.

The organic solvent is preferably used in an amount of 100 parts or less by volume based on 100 parts by volume of the alkaline aqueous solution. If the amount of the organic solvent exceeds 100 parts by volume, the exposed area may remain undeveloped due to a decrease in developability.

An appropriate amount of a surfactant and the like may also be added to the alkaline aqueous solution (developer).

After development using the alkaline aqueous solution (developer), the resist film is normally washed with water, and dried.

EXAMPLES

Hereinafter, the present invention is further described by way of examples. Note that the invention is not limited to the following examples. The unit "parts" refers to "parts by mass", and the unit "%" refers to "mass %" unless otherwise indicated.

In the synthesis examples, the properties of the resin were measured and evaluated as described below.

<Weight Average Molecular Weight (Mw) and Number Average Molecular Weight (Mn)>

The molecular weight (Mw and Mn) of the polymer was measured using a multi-angle laser light scattering detector (MALLS). The molecular weight was determined by gel permeation chromatography (GPC) using GPC columns manufactured by Tosoh Corporation (TSK gel α-2500 and TSK gel α-M) at a flow rate of 1.0 ml/min and a column temperature of 40° C. (eluant: dimethylformamide in which LiBr (30 mmol/l) and $H_3PO_4$ (10 mmol/l) were dissolved, detector: MALLS (DAWN DSP manufactured by Wyatt, cell type: K5, laser wavelength: 632.8 nm).

<$^1$H-NMR Analysis>

The polymer was subjected to $^1$H-NMR analysis using a nuclear magnetic resonance spectrometer "JNM-EX270" (manufactured by JEOL Ltd.).

<$^{13}$C-NMR Analysis>

The polymer was subjected to $^{13}$C-NMR analysis using a nuclear magnetic resonance spectrometer "JNM-EX270" (manufactured by JEOL Ltd.).

1. Synthesis of Monomer

<Synthesis of Monomer (P-1) (Example 1)>

267 g of 4-fluorophenyldiphenylsulfonium trifluoromethanesulfonate was dissolved in 2,000 g of dichloromethane, and the atmosphere of the system was replaced with nitrogen. After the addition of 2,000 g of a 10 wt % sodium hydroxide aqueous solution, 58 g of tetra-n-butylammonium bromide, and 72.1 g of cyclohexanethiol to the solution, the mixture was stirred at room temperature for 30 minutes. The mixture was transferred to a separating funnel, and allowed to stand. The aqueous layer was then removed. After washing the organic layer with 3,000 ml of distilled water, the aqueous layer was removed. The resulting dichloromethane solution was dried over anhydrous magnesium sulfate, and filtered. After evaporating dichloromethane from the solution, the residual liquid was dried under reduced pressure to obtain 192 g of 4-cyclohexylthiophenyldiphenylsulfonium trifluoromethanesulfonate. 192 g of 4-cyclohexylthiophenyldiphenylsulfonium trifluoromethanesulfonate was dissolved in 3,000 ml of methanol in a reaction flask. After the addition of 180 g of a 30 wt % hydrogen peroxide solution and 105 g of sodium tungstate dihydrate to the solution, the mixture was stirred at room temperature for 30 minutes. The resulting methanol solution was concentrated under reduced pressure, and the residue was dissolved in 3,000 g of dichloromethane. The solution was transferred to a separating funnel, and allowed to stand. The aqueous layer was then removed. After washing the organic layer with 1,000 ml of distilled water, the aqueous layer was removed. The resulting dichloromethane solution was dried over anhydrous magnesium sulfate, and filtered. After evaporating dichloromethane from the solution, the residual liquid was dried under reduced pressure to obtain 145 g of 4-cyclohexylsulfonylphenyldiphenylsulfonium trifluoromethanesulfonate. 145 g of 4-cyclohexylsulfonylphenyldiphenylsulfonium trifluoromethanesulfonate was dissolved in 1,000 g of methanol. The solution was subjected to ion-exchange chromatography (ion-exchange resin: Sephadex QAE A-25 manufactured by Aldrich (600 g)), and the collected organic layer was evaporated under reduced pressure to obtain 89 g of the compound represented by the following formula (XX).

A recovery flask was charged with 31.6 g of the compound represented by the following formula (X), 44.5 g of the compound represented by the formula (XX), 1,000 g of methylene chloride, and 1,000 g of water. The mixture was stirred at room temperature for 10 hours. After completion of the reaction, the methylene chloride layer was collected, and washed four times with 500 g of water. The methylene chloride layer was again collected, and methylene chloride was evaporated under reduced pressure to obtain the target compound represented by the following formula (P-1) (yield: 50%).

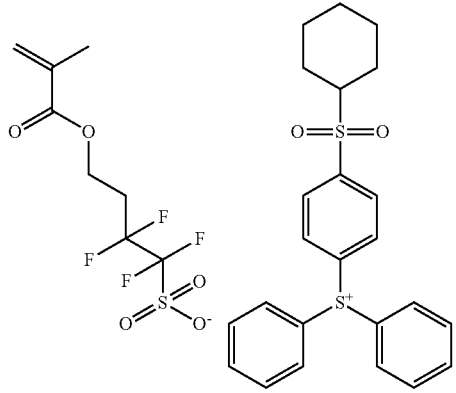

(P-1)

<Synthesis of Monomer (P-2) (Example 2)>

A recovery flask was charged with 24.6 g of the compound represented by the following formula (XXX), 43.9 g of the compound represented by the formula (XXXX), 1,000 g of methylene chloride, and 1,000 g of water. The mixture was stirred at room temperature for 10 hours. After completion of the reaction, the methylene chloride layer was collected, and washed four times with 500 g of water. The methylene chloride layer was again collected, and methylene chloride was evaporated under reduced pressure to obtain the target compound represented by the following formula (P-2) (yield: 43%).

The $^1$H-NMR analysis results for the resulting compound are shown below. $^1$H-NMR (270 MHz, DMSO-$d_6$, internal standard: TMS): δ (ppm)=1.84 (s, 3.0H), 1.85 (q, 2.0H), 2.46 (t, 2.0H), 4.12 (t, 2.0H), 5.60 (s, 1.0H), 5.97 (s, 1.0H), 7.50-8.40 (m, 19.0H).

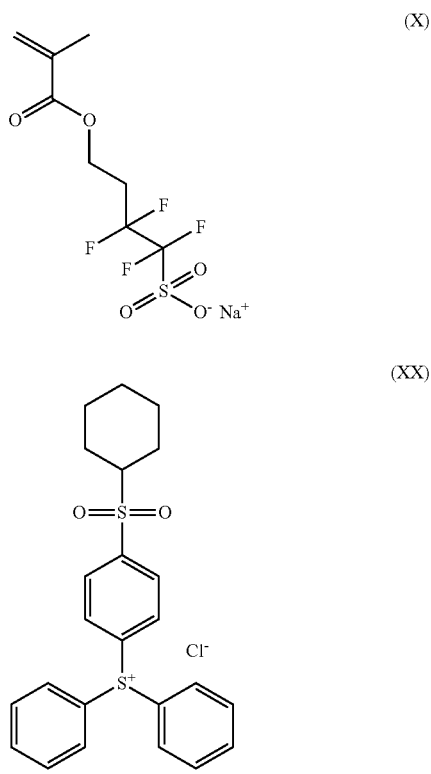

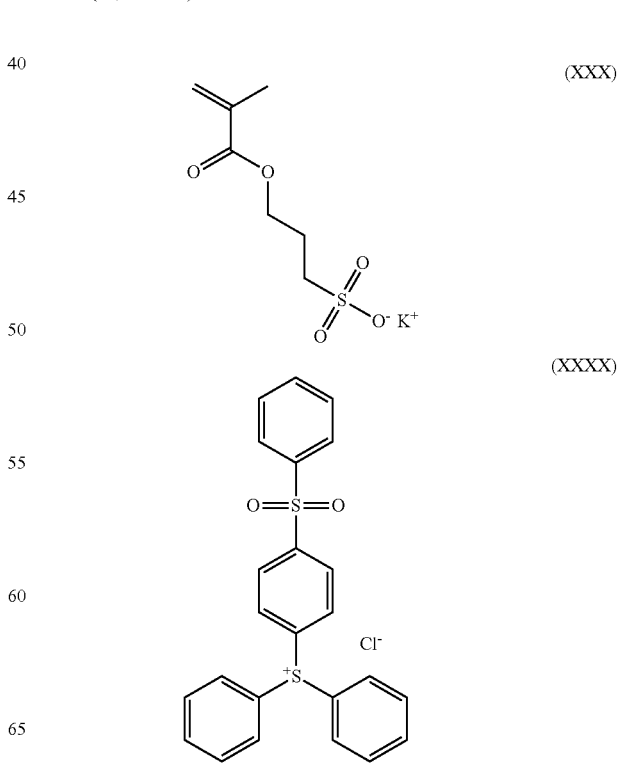

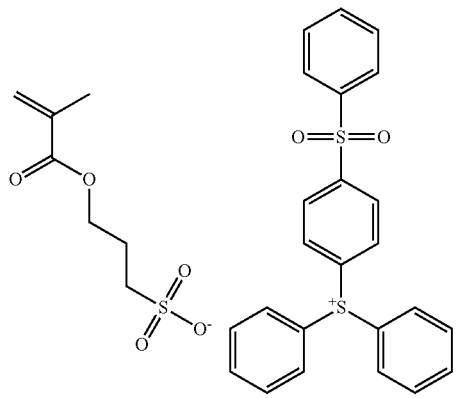

(P-2)

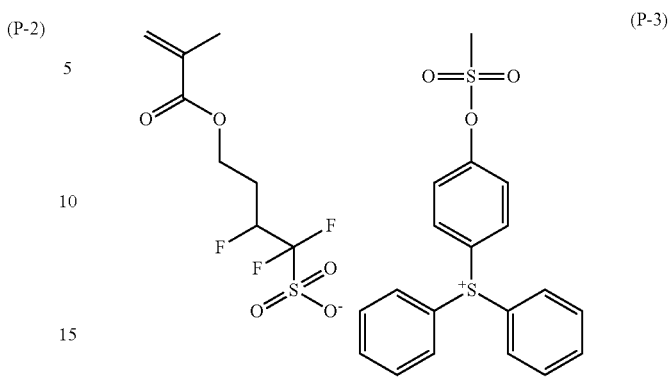

(P-3)

<Synthesis of Monomer (P-3) (Example 3)>

A recovery flask was charged with 29.8 g of the compound represented by the following formula (Y-1), 39.2 g of the compound represented by the formula (Z-1), 1,000 g of methylene chloride, and 1,000 g of water. The mixture was stirred at room temperature for 10 hours. After completion of the reaction, the methylene chloride layer was collected, and washed four times with 500 g of water. The methylene chloride layer was again collected, and methylene chloride was evaporated under reduced pressure to obtain the target compound represented by the following formula (P-3) (yield: 50%).

<Synthesis of Monomer (P-4) (Example 4)>

A recovery flask was charged with 33.0 g of the compound represented by the following formula (Y-2), 44.5 g of the compound represented by the formula (Z-2), 1,000 g of methylene chloride, and 1,000 g of water. The mixture was stirred at room temperature for 10 hours. After completion of the reaction, the methylene chloride layer was collected, and washed four times with 500 g of water. The methylene chloride layer was again collected, and methylene chloride was evaporated under reduced pressure to obtain the target compound represented by the following formula (P-4) (yield: 55%).

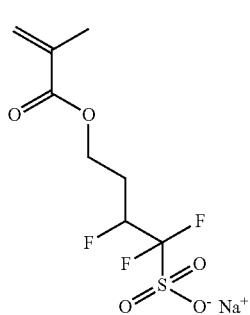

(Y-1)

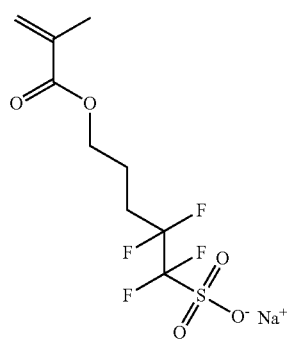

(Y-2)

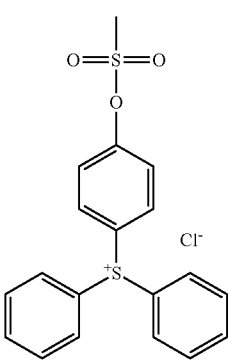

(Z-1)

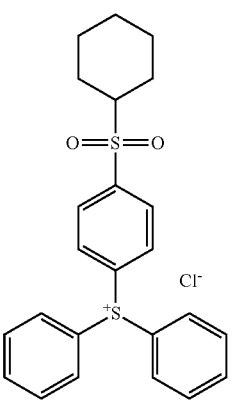

(Z-2)

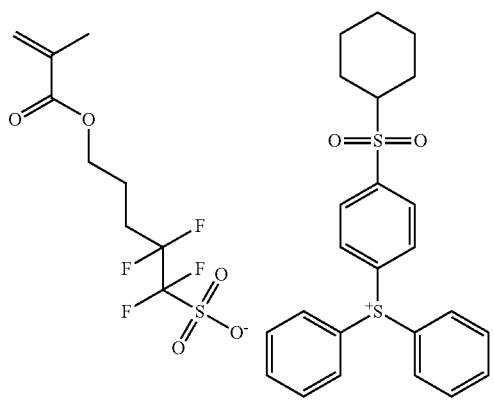

(P-4)

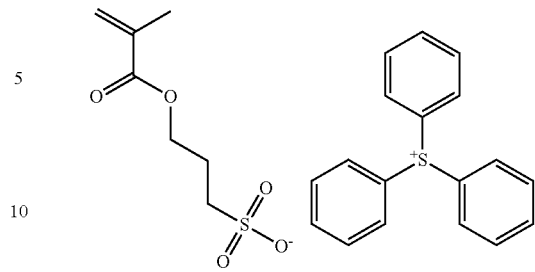

(P-6)

2. Synthesis of Polymer

<Synthesis of Polymer (A-1) (Example 6)>

40.51 g (50 mol %) of the compound represented by the following formula (M-1), 23.05 g (35 mol %) of the compound represented by the following formula (M-2), 36.45 g (15 mol %) of the monomer represented by the following formula (P-1) obtained in Example 1, and 5.65 g of 2,2'-azobisisobutyronitrile (AIBN) were dissolved in 200 g of 2-butanone to prepare a monomer solution. Separately, a three-necked flask (500 ml) was charged with 100 g of 2-butanone, and purged with nitrogen for 30 minutes. After heating the flask to 80° C. with stirring, the monomer solution was added dropwise to the flask over 3 hours using a dropping funnel. The monomers were polymerized for 6 hours from the start of addition of the monomer solution. After completion of polymerization, the polymer solution was cooled with water to 30° C. or lower, and added to 2,000 g of 2-propanol. A white powder (solid) precipitated was filtered off. The white powder was washed twice with 100 g of 2-propanol in a slurry state. The white powder was again filtered off, and dried at 50° C. for 12 hours to obtain a white powdery polymer (52 g, yield: 52%).

The polymer had Mw of 5,000 and Mw/Mn of 2.1. As a result of $^{13}$C-NMR analysis, it was found that the polymer was a copolymer containing repeating units derived from the compound (M-1), repeating units derived from the compound (M-2), and repeating units derived from the compound (P-1) in a molar ratio of 47:37:16. The polymer is hereinafter referred to as "polymer (A-1)".

<Synthesis of Monomer (P-5) (Example 5)>

A recovery flask was charged with 29.8 g of the compound represented by the formula (Y-1), 44.5 g of the compound represented by the formula (Z-2), 1,000 g of methylene chloride, and 1,000 g of water. The mixture was stirred at room temperature for 10 hours. After completion of the reaction, the methylene chloride layer was collected, and washed four times with 500 g of water. The methylene chloride layer was again collected, and methylene chloride was evaporated under reduced pressure to obtain the target compound represented by the following formula (P-5) (yield: 70%).

The $^1$H-NMR analysis results for the resulting compound are shown below. $^1$H-NMR (270 MHz, DMSO-d$_6$, internal standard: TMS): δ (ppm)=1.00-2.56 (m, 15.0H), 3.30-3.45 (m, 1.0H), 4.10-4.35 (m, 2.0H), 5.85-5.12 (m, 1.0H), 5.69 (s, 1.0H), 6.03 (s, 1.0H), 7.71-8.21 (m, 14.0H).

(P-5)

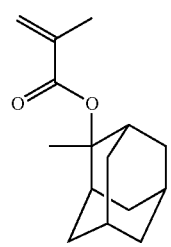

(M-1)

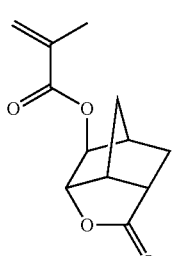

(M-2)

<Synthesis of Comparative Monomer (P-6)>

The compound represented by the following formula (P-6) for Comparative Example 1 was obtained in the same manner as described in Japanese Patent No. 3613491.

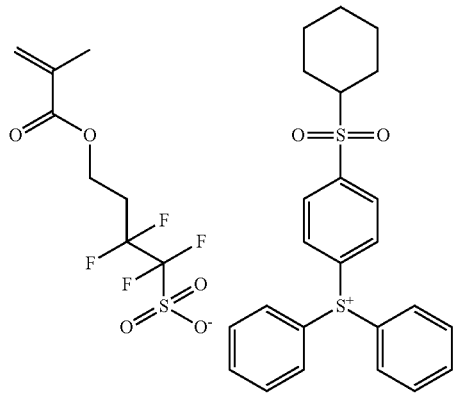

(P-1)

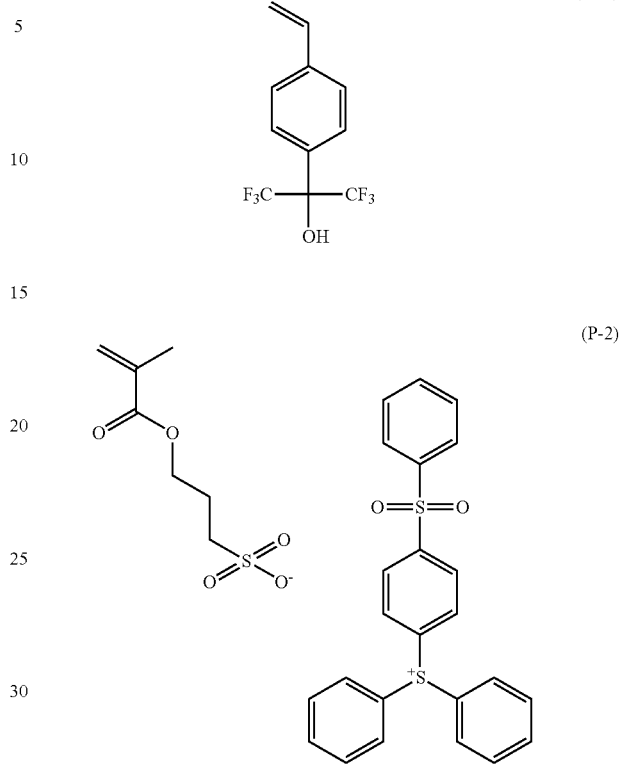

(M-4)

(P-2)

<Synthesis of Polymer (A-2) (Example 7)>

55.28 g (65 mol %) of the compound represented by the following formula (M-5), 23.50 g (25 mol %) of the compound represented by the following formula (M-4), 21.25 g (10 mol %) of the monomer represented by the following formula (P-2) obtained in Example 2, and 5.71 g of 2,2'-azobisisobutyronitrile (AIBN) were dissolved in 200 g of 2-butanone to prepare a monomer solution. Separately, a three-necked flask (500 ml) was charged with 100 g of 2-butanone, and purged with nitrogen for 30 minutes. After heating the flask to 80° C. with stirring, the monomer solution was added dropwise to the flask over 3 hours using a dropping funnel. The monomers were polymerized for 6 hours from the start of addition of the monomer solution. After completion of polymerization, the polymer solution was cooled with water to 30° C. or lower, and added to 2,000 g of n-hexane. A white powder (solid) precipitated was filtered off. The white powder was washed twice with 100 g of n-hexane in a slurry state. The white powder was again filtered off, and dried at 50° C. for 12 hours to obtain a white powdery polymer (55 g, yield: 55%).

The polymer had Mw of 6,600 and Mw/Mn of 1.9. As a result of $^{13}$C-NMR analysis, it was found that the polymer was a copolymer containing repeating units derived from the compound (M-5), repeating units derived from the compound (M-4), and repeating units derived from the compound (P-2) in a molar ratio of 62:28:10. The polymer is hereinafter referred to as "polymer (A-2)".

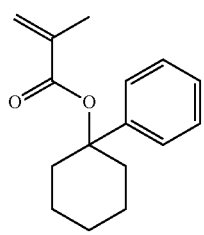

(M-5)

<Synthesis of Polymer (A-3) (Example 8)>

44.94 g (50 mol %) of the compound represented by the following formula (M-3), 32.17 g (40 mol %) of the compound represented by the following formula (M-2), 22.89 g (10 mol %) of the monomer represented by the following formula (P-3) obtained in Example 3, and 5.94 g of 2,2'-azobisisobutyronitrile (AIBN) were dissolved in 200 g of 2-butanone to prepare a monomer solution.

Separately, a three-necked flask (500 ml) was charged with 100 g of 2-butanone, and purged with nitrogen for 30 minutes. After heating the flask to 80° C. with stirring, the monomer solution was added dropwise to the flask over 3 hours using a dropping funnel. The monomers were polymerized for 6 hours from the start of addition of the monomer solution. After completion of polymerization, the polymer solution was cooled with water to 30° C. or lower, and added to 2,000 g of 2-propanol. A white powder (solid) precipitated was filtered off. The white powder was washed twice with 100 g of 2-propanol in a slurry state. The white powder was again filtered off, and dried at 50° C. for 12 hours to obtain a white powdery polymer (50 g, yield: 50%).

The polymer had Mw of 6,100 and a dispersity Mw/Mn of 1.8. As a result of $^{13}$C-NMR analysis, it was found that the polymer was a copolymer containing repeating units derived from the compound (M-3), repeating units derived from the compound (M-2), and repeating units derived from the compound (P-3) in a molar ratio of 45:44:11. The polymer is hereinafter referred to as "polymer (A-3)".

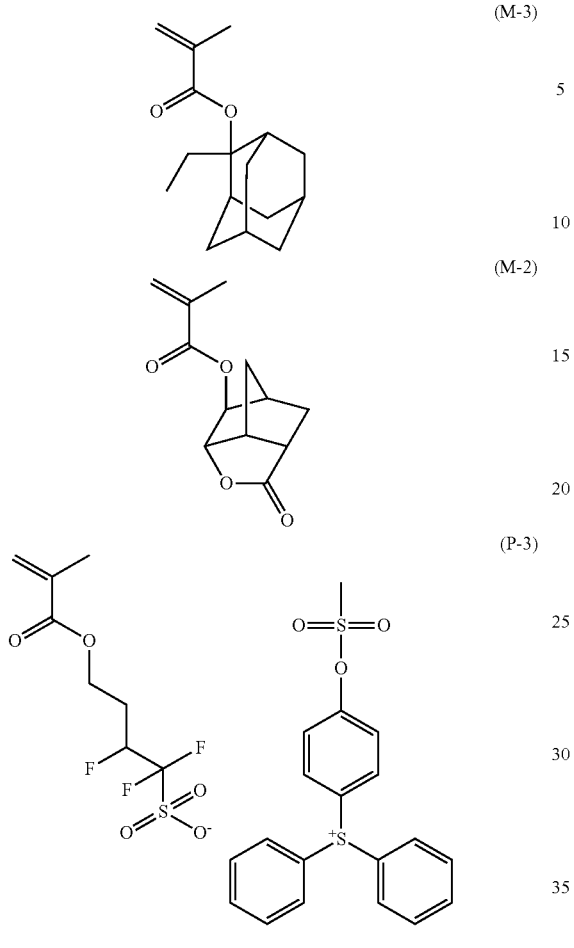

(M-3)

(M-2)

(P-3)

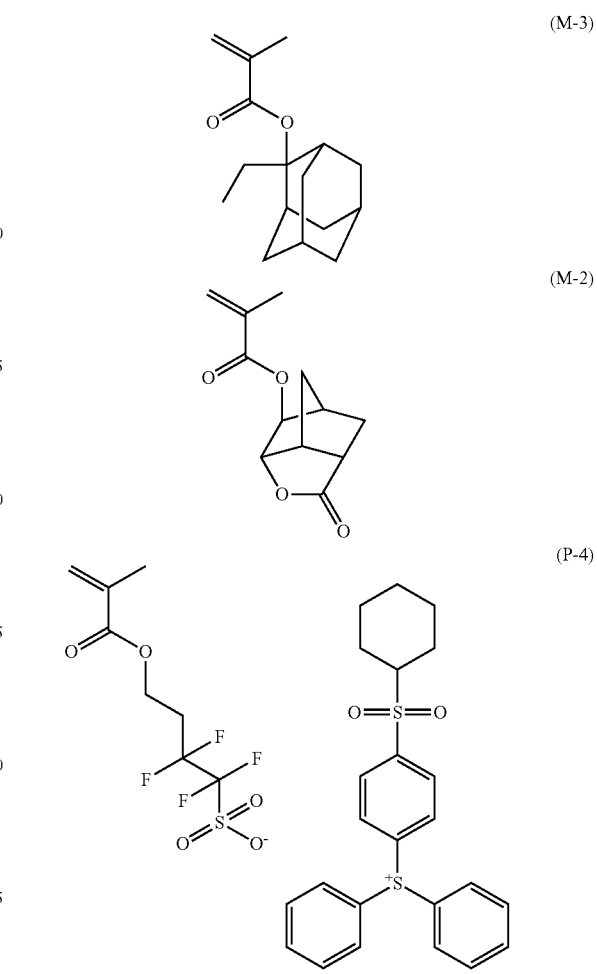

(M-3)

(M-2)

(P-4)

<Synthesis of Polymer (A-4) (Example 9)>

43.61 g (50 mol %) of the compound represented by the following formula (M-3), 31.22 g (40 mol %) of the compound represented by the following formula (M-2), 25.17 g (10 mol %) of the monomer represented by the following formula (P-4) obtained in Example 4, and 5.77 g of 2,2'-azobisisobutyronitrile (AIBN) were dissolved in 200 g of 2-butanone to prepare a monomer solution.

Separately, a three-necked flask (500 ml) was charged with 100 g of 2-butanone, and purged with nitrogen for 30 minutes. After heating the flask to 80° C. with stirring, the monomer solution was added dropwise to the flask over 3 hours using a dropping funnel. The monomers were polymerized for 6 hours from the start of addition of the monomer solution. After completion of polymerization, the polymer solution was cooled with water to 30° C. or lower, and added to 2,000 g of 2-propanol. A white powder (solid) precipitated was filtered off. The white powder was washed twice with 100 g of 2-propanol in a slurry state. The white powder was again filtered off, and dried at 50° C. for 12 hours to obtain a white powdery polymer (52 g, yield: 52%).

The polymer had Mw of 6,300 and Mw/Mn of 1.9. As a result of $^{13}$C-NMR analysis, it was found that the polymer was a copolymer containing repeating units derived from the compound (M-3), repeating units derived from the compound (M-2), and repeating units derived from the compound (P-4) in a molar ratio of 44:45:11. The polymer is hereinafter referred to as "polymer (A-4)".

<Synthesis of Polymer (A-5) (Example 10)>

39.42 g (47 mol %) of the compound represented by the following formula (M-6), 51.13 g (50 mol %) of the compound represented by the following formula (M-2), 9.45 g (3 mol %) of the monomer represented by the following formula (P-5) obtained in Example 5, and 3.02 g of 2,2'-azobisisobutyronitrile (AIBN) were dissolved in 200 g of 2-butanone to prepare a monomer solution.

Separately, a three-necked flask (500 ml) was charged with 100 g of 2-butanone, and purged with nitrogen for 30 minutes. After heating the flask to 80° C. with stirring, the monomer solution was added dropwise to the flask over 3 hours using a dropping funnel. The monomers were polymerized for 6 hours from the start of addition of the monomer solution. After completion of polymerization, the polymer solution was cooled with water to 30° C. or lower, and added to 2,000 g of 2-propanol. A white powder (solid) precipitated was filtered off. The white powder was washed twice with 100 g of 2-propanol in a slurry state. The white powder was again filtered off, and dried at 50° C. for 12 hours to obtain a white powdery polymer (68 g, yield: 68%).

The polymer had Mw of 8,800 and Mw/Mn of 2.2. As a result of $^{13}$C-NMR analysis, it was found that the polymer was a copolymer containing repeating units derived from the compound (M-6), repeating units derived from the compound (M-2), and repeating units derived from the compound (P-5) in a molar ratio of 47:50:3. The polymer is hereinafter referred to as "polymer (A-5)".

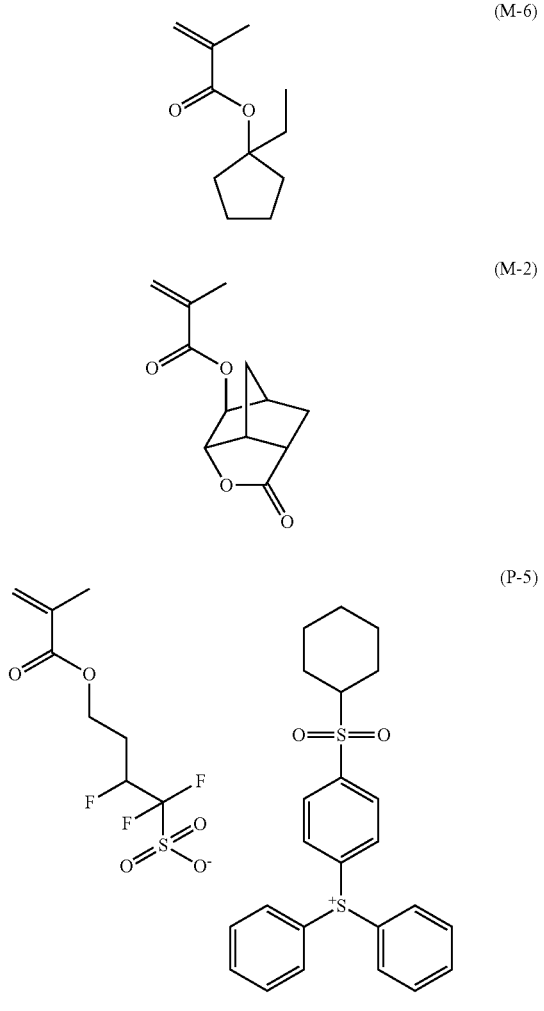
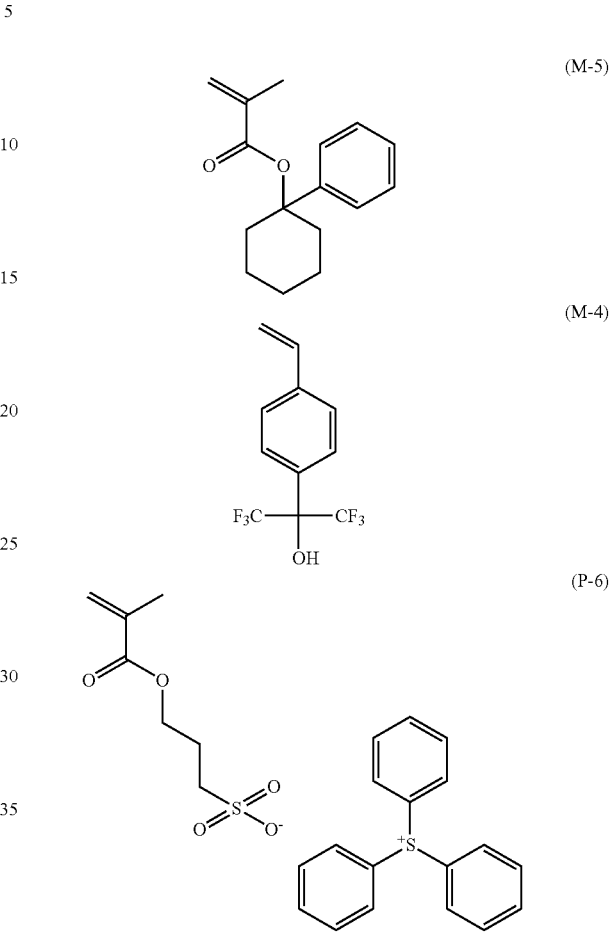

compound (M-5), repeating units derived from the compound (M-4), and repeating units derived from the compound (P-6) in a molar ratio of 64:26:10. The polymer is hereinafter referred to as "comparative polymer (a1)".

<Synthesis of Comparative Polymer (a1) (Comparative Example 1)>

58.09 g (65 mol %) of the compound represented by the following formula (M-5), 24.70 g (25 mol %) of the compound represented by the following formula (M-4), 17.21 g (10 mol %) of the comparative monomer (monomer represented by the following formula (P-6)), and 6.01 g of 2,2'-azobisisobutyronitrile (AIBN) were dissolved in 200 g of 2-butanone to prepare a monomer solution. Separately, a three-necked flask (500 ml) was charged with 100 g of 2-butanone, and purged with nitrogen for 30 minutes. After heating the flask to 80° C. with stirring, the monomer solution was added dropwise to the flask over 3 hours using a dropping funnel. The monomers were polymerized for 6 hours from the start of addition of the monomer solution. After completion of polymerization, the polymer solution was cooled with water to 30° C. or lower, and added to 2,000 g of n-hexane. A white powder (solid) precipitated was filtered off. The white powder was washed twice with 100 g of n-hexane in a slurry state. The white powder was again filtered off, and dried at 50° C. for 12 hours to obtain a white powdery polymer (52 g, yield: 52%).

The polymer had Mw of 6,400 and Mw/Mn of 1.9. As a result of $^{13}$C-NMR analysis, it was found that the polymer was a copolymer containing repeating units derived from the 3. Preparation of Radiation-Sensitive Resin Composition <Examples 11 to 15 and Comparative Example 1>

The polymer (A), acid diffusion controller (B), acid generator (C), and solvent (D) were mixed in the ratio shown in Table 1. The resulting solution was filtered through a membrane filter having a pore size of 200 nm to prepare a composition solution (radiation-sensitive resin composition) for Examples 11 to 15 and Comparative Example 1.

The details of the polymer (A), acid diffusion controller (B), acid generator (C), and solvent (D) are shown below.

Polymer (A)

(A-1) to (A-5) and (a1): polymers (A-1) to (A-5) and (a1)

Acid diffusion controller (B)

(B-1): tri-n-octylamine (B-2): triphenylsulfonium salicylate

Acid generator (C)

(C-1): triphenylsulfonium nonafluoro-n-butanesulfonate

Solvent (D)

(D-1): ethyl lactate (D-2): propylene glycol monomethyl ether acetate (D-3): cyclohexanone

TABLE 1

| | Polymer (A) | | Acid diffusion controller (B) | | Acid generator (C) | | Solvent (D) | |
|---|---|---|---|---|---|---|---|---|
| | Type | Amount (parts) | Type | Amount (parts) | Type | Amount (parts) | Type | Amount (parts) |
| Example 11 | A-1 | 100 | B-1 | 2 | — | — | D-2 | 3300 |
| | | | | | | | D-3 | 1400 |
| Example 12 | A-2 | 100 | B-1 | 2 | — | — | D-1 | 3300 |
| | | | | | | | D-2 | 1400 |
| Example 13 | A-3 | 100 | B-1 | 2 | — | — | D-2 | 3300 |
| | | | | | | | D-3 | 1400 |
| Example 14 | A-4 | 100 | B-2 | 3 | — | — | D-2 | 3300 |
| | | | | | | | D-3 | 1400 |
| Example 15 | A-5 | 100 | B-2 | 2 | C-1 | 1 | D-2 | 3300 |
| | | | | | | | D-3 | 1400 |
| Example 16 | A-5 | 100 | B-1 | 2 | — | — | D-2 | 2600 |
| | | | | | | | D-3 | 1300 |
| Example 17 | A-5 | 100 | B-2 | 2 | — | — | D-2 | 2600 |
| | | | | | | | D-3 | 1300 |
| Comparative Example 1 | a1 | 100 | B-1 | 2 | — | — | D-1 | 3300 |
| | | | | | | | D-2 | 1400 |

4. Preparation of Upper Layer Film-Forming Composition
(4-1) Synthesis of Resin Component
<Synthesis of Resin (A-7)>

46.95 g (85 mol %) of (1,1,1-trifluoro-2-trifluoromethyl-2-hydroxy-4-pentyl)methacrylate and 6.91 g of 2,2'-azobis(methyl 2-methylpropionate) as an initiator were dissolved in 100 g of isopropanol to prepare a monomer solution. Separately, a three-necked flask (500 ml) equipped with a thermometer and a dropping funnel was charged with 50 g of isopropanol, and purged with nitrogen for 30 minutes. The isopropanol contained in the flask was heated to 80° C. with stirring using a magnetic stirrer. The monomer solution was then added dropwise to the flask over 2 hours using the dropping funnel. After the addition, the mixture was reacted for 1 hour. After the dropwise addition of 10 g of an isopropanol solution of 3.05 g (15 mol %) of vinylsulfonic acid to the flask over 30 minutes, the mixture was reacted for 1 hour. The mixture was then cooled to 30° C. or lower to obtain a copolymer solution.

The copolymer solution was concentrated to 150 g, and transferred to a separating funnel. 50 g of methanol and 600 g of n-hexane were added to the separating funnel to effect separation and purification. The lower layer solution thus separated was collected. The lower layer solution was diluted with isopropanol so that the amount of the diluted solution was 100 g, and transferred to the separating funnel. 50 g of methanol and 600 g of n-hexane were added to the separating funnel to effect separation and purification. The lower layer solution thus separated was collected. The solvent of the lower layer solution was replaced with 4-methyl-2-pentanol so that the total amount of the mixture was 250 g. 250 g of water was added to the mixture to effect separation and purification, and the upper layer solution was collected. The solvent of the upper layer solution was replaced with 4-methyl-2-pentanol to obtain a resin solution.

The copolymer contained in the resin solution had Mw of 9760 and Mw/Mn of 1.51. The yield was 65%. The copolymer contained repeating units derived from (1,1,1-trifluoro-2-trifluoromethyl-2-hydroxy-4-pentyl)methacrylate and repeating units derived from vinylsulfonic acid in a ratio of 95:5 (mol %). The copolymer is hereinafter referred to as "resin (A-7)".

<Synthesis of Resin (A-8)>

A monomer solution (i) was prepared by dissolving 22.26 g of (1,1,1,3,3,3-hexafluoro-2-propyl)methacrylate and 4.64 g of 2,2-azobis(methyl 2-methylpropionate) in 25 g of methyl ethyl ketone, and a monomer solution (ii) was prepared by dissolving 27.74 g of (1,1,1-trifluoro-2-trifluoromethyl-2-hydroxy-4-pentyl)methacrylate in 25 g of methyl ethyl ketone. Separately, a three-necked flask (500 ml) equipped with a thermometer and a dropping funnel was charged with 100 g of methyl ethyl ketone, and purged with nitrogen for 30 minutes. The methyl ethyl ketone contained in the flask was heated to 80° C. with stirring using a magnetic stirrer. The monomer solution (i) was added dropwise to the flask over 20 minutes using the dropping funnel, and aged for 20 minutes. The monomer solution (ii) was then added dropwise to the flask over 20 minutes. The mixture was reacted for 1 hour, and cooled to 30° C. or lower to obtain a copolymer solution.

The copolymer solution thus obtained was concentrated to 150 g, and transferred to a separating funnel. 50 g of methanol and 400 g of n-hexane were added to the separating funnel to effect separation and purification. The lower layer solution thus separated was collected. The solvent of the lower layer solution was replaced with 4-methyl-2-pentanol to obtain a resin solution.

The copolymer contained in the resin solution had Mw of 5,730 and Mw/Mn of 1.23. The yield was 26%. The copolymer contained repeating units derived from (1,1,1,3,3,3-hexafluoro-2-propyl)methacrylate and repeating units derived from (1,1,1-trifluoro-2-trifluoromethyl-2-hydroxy-4-pentyl)methacrylate in a ratio of 50.3:49.7 (mol %). The copolymer is hereinafter referred to as "resin (A-8)".

(4-2) Preparation of Upper Layer Film-Forming Composition 100 parts of the resin (A-7), 10 parts of the resin (A-8), 1,680 parts of 4-methyl-2-pentanol and 1,120 parts of diisoamyl ether as a solvent were mixed. The mixture was stirred for 2 hours, and filtered through a filter having a pore size of 200 nm to prepare an upper layer film-forming composition having a solid content of 4%.

5-1. Evaluation of Radiation-Sensitive Resin Composition (EB Exposure)

The composition solution (radiation-sensitive resin compositions of Examples 11 to 15 and Comparative Example 1) was spin-coated onto a silicon wafer using a coater/developer "CLEAN TRACK ACT-8" manufactured by Tokyo Electron, Ltd., and prebaked (PB) under the conditions shown in Table 2 to form a resist film having a thickness of 60 nm. The resist film was exposed to electron beams using an electron beam writing system "HL800D" manufactured by Hitachi, Ltd., under condition of output: 50 KeV, and current density: 5.0

A/cm². The resist film was then subjected to post-exposure bake (PEB) under the conditions shown in Table 2. The resist film subjected to PEB was developed at 23° C. for 1 minute by a puddle method using a 2.38% tetramethylammonium hydroxide aqueous solution, rinsed with purified water, and dried to obtain a resist pattern. The resist thus obtained was evaluated as described below. The evaluation results for the radiation-sensitive resin compositions of Examples 11 to 15 and Comparative Example 1 are shown in Table 2.

(1) Sensitivity (L/S)

A dose at which a line-and-space pattern (1L1S) including a line area (width: 150 nm) and a space area (groove) (width: 150 nm) formed between the adjacent line areas was formed at a line width of 1:1 was defined as an optimum dose, and the sensitivity was evaluated based on the optimum dose.

Figure 2:
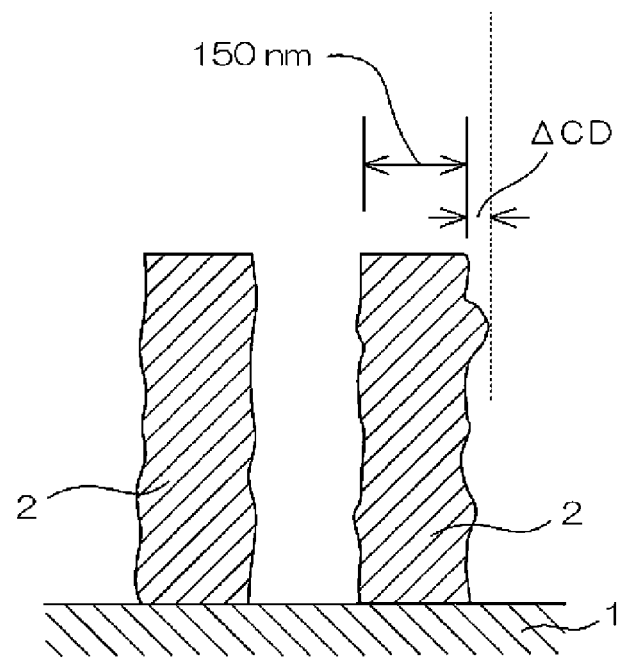
FIG. 2 is a cross-sectional view schematically showing the shape of a line pattern.

FIG. 1 is a plan view schematically showing the shape of the line-and-space pattern. FIG. 2 is a cross-sectional view schematically showing the shape of the line-and-space pattern. Note that elevations and depressions are exaggerated in FIGS. 1 and 2.

(2) Nano-Edge Roughness

The line pattern of a line-and-space pattern (1L1S) (design line width: 150 nm) was observed using a scanning electron microscope "S-9220" manufactured by Hitachi, Ltd. The nano-edge roughness was evaluated by determining the difference "ΔCD" between the design line width (150 nm) and the line width in an area where elevations and depressions significantly occurred along a side 2a of a line area 2 of a resist film formed on a silicon wafer 1 (see FIGS. 1 and 2) using a CD-scanning electron microscope (SEM) "S-9220" manufactured by Hitachi High-Technologies Corporation.

(3) Resolution (L/S)

The minimum line width (nm) of the line pattern of a line-and-space pattern (1L1S) that was resolved at the optimum dose was taken as the resolution.

Nikon Corporation (NA=1.3, ratio=0.800, Annular). The film was then subjected to post-exposure bake (PEB) for 60 seconds at the temperature shown in Table 3. The film was then developed using a 2.38 wt % tetramethylammonium hydroxide aqueous solution, rinsed with water, and dried to form a positive-tone resist pattern. The resist pattern thus obtained was evaluated as described below. The evaluation results are shown in Table 3.

(4) Mask Error Enhancement Factor (MEEF)

A dose at which a line-and-space (LS) pattern having a line width of 50 nm was formed by exposure through a mask pattern (target size: 50 nm 1L/1S) under the above evaluation conditions was determined to be an optimum dose. An LS pattern (pitch: 100 nm) was formed at the optimum dose using a mask pattern (line width target size: 46 nm, 48 nm, 50 nm, 52 nm, or 54 nm), and the line width of the resist film was measured using a scanning electron microscope (SEM) "CG4000" manufactured by Hitachi, Ltd.

A graph was drawn by plotting the target size (nm) (horizontal axis) and the line width (nm) of the resist film formed using each mask pattern (vertical axis), and the slope of the straight line of the graph was calculated to be the mask error enhancement factor (MEEF).

The mask production cost can be reduced by reducing the MEEF.

(5) Nano-Edge Roughness

A dose at which a resist pattern having a line width of 50 nm was formed by exposure through a mask pattern (target size: 50 nm 1L/1.8S) under the above evaluation conditions was determined to be an optimum dose. The line width of a 50 nm 1L/1.8S pattern obtained at the optimum dose was observed from above at an arbitrary ten points using a scanning electron microscope (SEM) "CG4000" manufactured by Hitachi, Ltd., and a variation (3σ) in line width was taken as the LWR. A small LWR value indicates that the pattern has excellent linearity.

TABLE 2

|  | PB conditions | | PEB conditions | | | | |
|---|---|---|---|---|---|---|---|
|  | Temp. (° C.) | Time (sec) | Temp. (° C.) | Time (sec) | Sensitivity (μC/cm²) | Nano-edge roughness (nm) | Resolution (nm) |
| Example 11 | 130 | 90 | 150 | 90 | 49.0 | 12 | 60 |
| Example 12 | 130 | 90 | 140 | 90 | 51.0 | 10 | 60 |
| Example 13 | 130 | 90 | 150 | 90 | 51.0 | 12 | 60 |
| Example 14 | 130 | 90 | 150 | 90 | 50.0 | 11 | 60 |
| Example 15 | 130 | 90 | 150 | 90 | 46.0 | 12 | 60 |
| Comparative Example 1 | 130 | 90 | 140 | 90 | 51.0 | 15 | 80 |

5-2. Evaluation of Radiation-Sensitive Resin Composition (ArF Exposure)

A film (thickness: 75 nm) of the radiation-sensitive resin composition was formed on a 12-inch silicon wafer on which an underlayer antireflective film "ARC66" manufactured by Nissan Chemical Industries, Ltd. was formed. The film was prebaked (PB) for 60 seconds at the temperature shown in Table 3. The upper-layer film-forming composition prepared in the section "[4] Preparation of upper layer film-forming composition" was spin-coated onto the film, and prebaked (PB) at 90° C. for 60 seconds to form a film having a thickness of 90 nm. The film was exposed via a mask pattern using an ArF immersion scanner "NSR S610C" manufactured by (6) Minimum Pre-Collapse Dimension The resist film was exposed through a mask pattern (target size: 50 nm 1L/1.8S) under the above evaluation conditions while changing the dose by 1 mJ. The line width of the pattern formed at a dose lower by 1 mJ than the dose at which line collapse occurred was taken as the minimum pre-collapse dimension (measured using a scanning electron microscope (SEM) "CG4000" manufactured by Hitachi, Ltd.).

A small minimum pre-collapse dimension indicates that the pattern has excellent collapse resistance.

A small minimum pre-collapse dimension indicates that the pattern has excellent collapse resistance.

TABLE 3

| | PB conditions | | PEB conditions | | | | Minimum |
|---|---|---|---|---|---|---|---|
| | Temp. (°C.) | Time (sec) | Temp. (°C.) | Time (sec) | MEEF | Nano-edge roughness (nm) | pre-collapse dimension (nm) |
| Example 16 | 110 | 60 | 140 | 60 | 3.3 | 4.3 | 33 |
| Example 17 | 110 | 60 | 150 | 60 | 3.1 | 4.1 | 32 |

As shown in Tables 2 and 3, it was confirmed that the radiation-sensitive resin compositions of Examples 11 to 17 including any of the polymers (A-1) to (A-5) including a specific repeating unit can form a chemically-amplified positive-tone resist film that effectively responds to electron beams or extreme ultraviolet rays, shows a low degree of roughness and excellent sensitivity, and accurately and stably produces a fine pattern, as compared with the radiation-sensitive resin composition of Comparative Example 1.

Since the radiation-sensitive resin composition according to the embodiments of the invention exhibits high resolution when forming a line-and-space pattern, and shows only a low degree of nano-edge roughness, the radiation-sensitive resin composition may be useful for forming a fine pattern using electron beams or extreme ultraviolet rays. Therefore, the radiation-sensitive resin composition may be very useful as a material for forming a chemically-amplified resist used to produce semiconductor devices that are expected to be further scaled down in the future.

More specifically, the radiation-sensitive resin composition is used as a chemically-amplified resist suitable for microfabrication that utilizes various types of radiation including KrF excimer laser light, ArF excimer laser light, $F_2$ excimer laser light, an (extreme) deep ultraviolet ray such as EUV light, X-rays such as synchrotron radiation, and charged particle rays such as electron beams. The novel polymer containing a sulfonic acid salt is used for the composition. The novel monomer is used for the polymer and the method for producing the radiation-sensitive resin composition.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a polymer; and
a solvent,
said polymer including a following repeating unit represented by a general formula (I), a following repeating unit represented by a general formula (II), or both thereof,

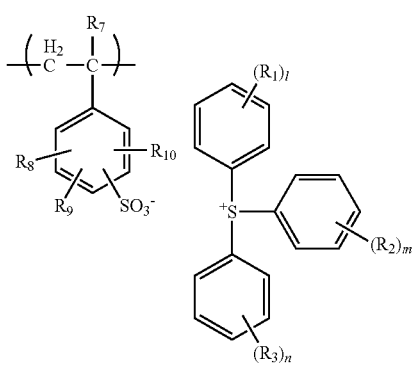

(I)

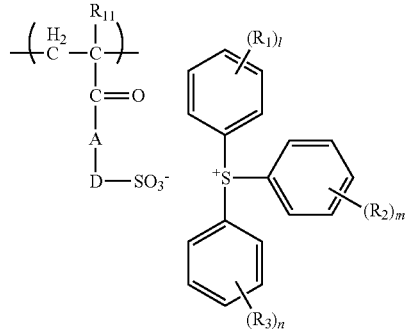

(II)

wherein
each of $R_1$ to $R_3$ independently represents a hydroxyl group, a halogen atom, a substituted or unsubstituted alkyl group, a substituted or unsubstituted cycloalkyl group, a substituted or unsubstituted alkoxy group, —S—$R_6$, or a group having two or more heteroatoms,
wherein
$R_6$ represents a substituted or unsubstituted alkyl group, or a substituted or unsubstituted aryl group,
at least one $R_1$ represents the group having two or more heteroatoms,
the group having two or more heteroatoms represented by the at least one $R_1$ includes a heteroatomic group represented by —OSO$_2$—, —SO$_2$—, —CONH—, or —SO$_2$N(Ry)-, wherein Ry represents a hydrogen atom, a substituted or unsubstituted alkyl group, a substituted or unsubstituted cycloalkyl group, a substituted or unsubstituted alkoxy group, or a substituted or unsubstituted aryl group, and
the heteroatomic group is directly bonded to the benzene ring bonded to $S^+$,
l is an integer from 1 to 5,
each of m and n is independently an integer from 0 to 5,
each of $R_7$ and $R_{11}$ independently represents a hydrogen atom, a halogen atom, a cyano group, or a substituted or unsubstituted alkyl group,
each of $R_8$ to $R_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group,
A represents —O— or —NR$_{12}$—, wherein R$_{12}$ represents a hydrogen atom, a substituted or unsubstituted alkyl group, or a substituted or unsubstituted aryl group, and
D represents a substituted or unsubstituted methylene group, a substituted or unsubstituted alkylene group, or a substituted or unsubstituted arylene group.

2. The radiation-sensitive resin composition according to claim 1, wherein said group having two or more heteroatoms is —OSO$_2$-Rx, —SO$_2$-Rx, or both thereof, wherein each of Rx independently represents a substituted or unsubstituted alkyl group, a substituted or unsubstituted cycloalkyl group, a substituted or unsubstituted alkoxy group, or a substituted or unsubstituted aryl group.

3. The radiation-sensitive resin composition according to claim 1, wherein said polymer further includes a structural unit containing an acid-labile group.

4. The radiation-sensitive resin composition according to claim 3, wherein said acid-labile group-containing structural unit comprises a structural unit represented by a following general formula (c-1),

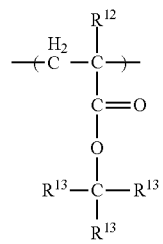
(c-1)

wherein
R$^{12}$ represents a hydrogen atom, a methyl group, a trifluoromethyl group, or a hydroxymethyl group, and
each of R$^{13}$ independently represents a linear or branched alkyl group having 1 to 4 carbon atoms, a monovalent alicyclic hydrocarbon group having 4 to 20 carbon atoms or a group derived therefrom, or a substituted or unsubstituted aryl group having 6 to 22 carbon atoms, or
two of R$^{13}$ bond to each other to form a divalent alicyclic hydrocarbon group having 4 to 20 carbon atoms or a group derived therefrom, together with a carbon atom that is bonded to the two of R$^{13}$, and one of R$^{13}$ other than the two of R$^{13}$ represents a linear or branched alkyl group having 1 to 4 carbon atoms, a monovalent alicyclic hydrocarbon group having 4 to 20 carbon atoms or a group derived therefrom, or a substituted or unsubstituted aryl group having 6 to 22 carbon atoms.

5. The radiation-sensitive resin composition according to claim 1, further comprising a compound represented by a following general formula (B1),

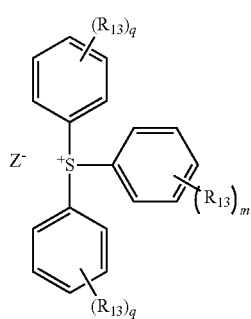
(B1)

wherein
each of R$_{13}$ independently represents a monovalent organic group,
Z$^-$ represents R$_{15}$O$^-$ or R$_{15}$COO$^-$, wherein R$_{15}$ represents a monovalent organic group, and each of q is independently an integer from 0 to 5.

6. A radiation-sensitive resin composition comprising:
a polymer;
a cation; and
a solvent,
wherein said polymer includes a following repeating unit represented by a general formula (I-a), a following repeating unit represented by a general formula (II-a), or both thereof, and said cation is represented by a general formula (III),

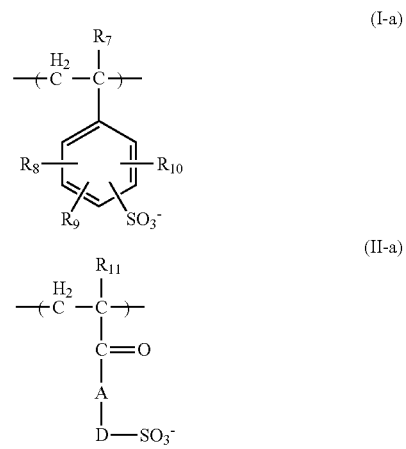

wherein
each of R$_7$ and R$_{11}$ independently represents a hydrogen atom, a halogen atom, a cyano group, or a substituted or unsubstituted alkyl group,
each of R$_8$ to R$_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group,
A represents —O— or —NR$_{12}$—, wherein R$_{12}$ represents a hydrogen atom, a substituted or unsubstituted alkyl group, or a substituted or unsubstituted aryl group, and
D represents a substituted or unsubstituted methylene group, a substituted or unsubstituted alkylene group, or a substituted or unsubstituted arylene group,

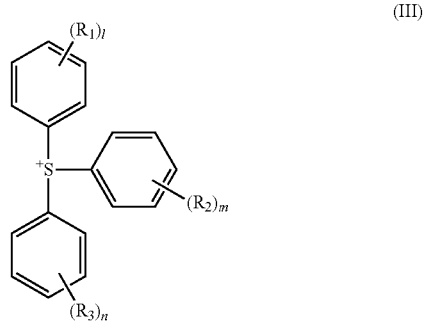
(III)

wherein
each of R$_1$ to R$_3$ independently represents a hydroxyl group, a halogen atom, a substituted or unsubstituted alkyl group, a substituted or unsubstituted cycloalkyl group, a substituted or unsubstituted alkoxy group, —S—R$_6$, or a group having two or more heteroatoms, wherein
R$_6$ represents a substituted or unsubstituted alkyl group, or a substituted or unsubstituted aryl group,
at least one R$_1$ represents the group having two or more heteroatoms,
the group having two or more heteroatoms represented by the at least one R$_1$ includes a heteroatomic group represented by —OSO$_2$—, —SO$_2$—, —CONH—, or —SO$_2$N(Ry)-, wherein Ry represents a hydrogen atom, a substituted or unsubstituted alkyl group, a substituted or unsubstituted cycloalkyl group, a substituted or unsubstituted alkoxy group, or a substituted or unsubstituted aryl group, and
the heteroatomic group is directly bonded to the benzene ring bonded to S$^+$,
l is an integer from 1 to 5, and
each of m and n is independently an integer from 0 to 5.

7. The radiation-sensitive resin composition according to claim 6, wherein said group having two or more heteroatoms is —OSO$_2$-Rx, —SO$_2$-Rx, or both thereof, wherein each of Rx independently represents a substituted or unsubstituted alkyl group, a substituted or unsubstituted cycloalkyl group, a substituted or unsubstituted alkoxy group, or a substituted or unsubstituted aryl group.

8. The radiation-sensitive resin composition according to claim 6, wherein said polymer further includes a structural unit containing an acid-labile group.

9. The radiation-sensitive resin composition according to claim 8, wherein said acid-labile group-containing structural unit comprises a structural unit represented by a following general formula (c-1),

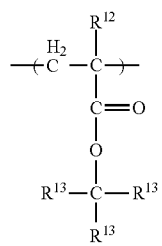

(c-1)

wherein
R$^{12}$ represents a hydrogen atom, a methyl group, a trifluoromethyl group, or a hydroxymethyl group, and
each of R$^{13}$ independently represents a linear or branched alkyl group having 1 to 4 carbon atoms, a monovalent alicyclic hydrocarbon group having 4 to 20 carbon atoms or a group derived therefrom, or a substituted or unsubstituted aryl group having 6 to 22 carbon atoms, or two of R$^{13}$ bond to each other to form a divalent alicyclic hydrocarbon group having 4 to 20 carbon atoms or a group derived therefrom, together with a carbon atom that is bonded to the two of R$^{13}$, and one of R$^{13}$ other than the two of R$^{13}$ represents a linear or branched alkyl group having 1 to 4 carbon atoms, a monovalent alicyclic hydrocarbon group having 4 to 20 carbon atoms or a group derived therefrom, or a substituted or unsubstituted aryl group having 6 to 22 carbon atoms.

10. The radiation-sensitive resin composition according to claim 6, further comprising a compound represented by a following general formula (B1),

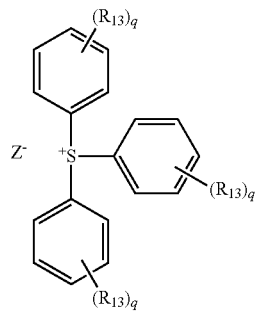

(B1)

wherein
each of R$_{13}$ independently represents a monovalent organic group,
Z$^-$ represents R$_{15}$O$^-$ or R$_{15}$COO$^-$, wherein R$_{15}$ represents a monovalent organic group, and
each of q is independently an integer from 0 to 5.

11. A monomer represented by a following general formula (I-m) or a following general formula (II-m),

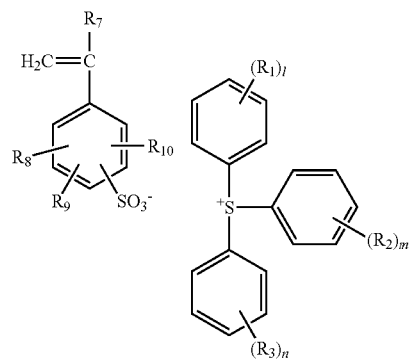

(I-m)

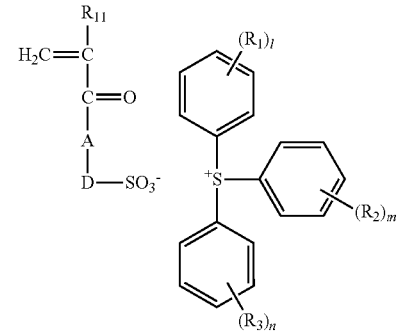

(II-m)

wherein
each of R$_1$ to R$_3$ independently represents a hydroxyl group, a halogen atom, a substituted or unsubstituted alkyl group, a substituted or unsubstituted cycloalkyl group, a substituted or unsubstituted alkoxy group, —S—R$_6$, or a group having two or more heteroatoms,
wherein
R$_6$ represents a substituted or unsubstituted alkyl group, or a substituted or unsubstituted aryl group,
at least one R$_1$ represents the group having two or more heteroatoms,
the group having two or more heteroatoms represented by the at least one R$_1$ includes a heteroatomic group represented by —OSO$_2$—, —SO$_2$—, —CONH—, or —SO$_2$N(Ry)-, wherein Ry represents a hydrogen atom, a substituted or unsubstituted alkyl group, a substituted or unsubstituted cycloalkyl group, a substituted or unsubstituted alkoxy group, or a substituted or unsubstituted aryl group, and the heteroatomic group is directly bonded to the benzene ring bonded to S$^+$, l is an integer from 1 to 5, each of m and n is independently an integer from 0 to 5, each of $R_7$ and $R_{11}$ independently represents a hydrogen atom, a halogen atom, a cyano group, or a substituted or unsubstituted alkyl group, each of $R_8$ to $R_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —NR$_{12}$—, wherein R$_{12}$ represents a hydrogen atom, a substituted or unsubstituted alkyl group, or a substituted or unsubstituted aryl group, and D represents a substituted or unsubstituted methylene group, a substituted or unsubstituted alkylene group, or a substituted or unsubstituted arylene group.

12. A polymer comprising:

a following repeating unit represented by a general formula (I), a following repeating unit represented by a general formula (II) or both thereof,

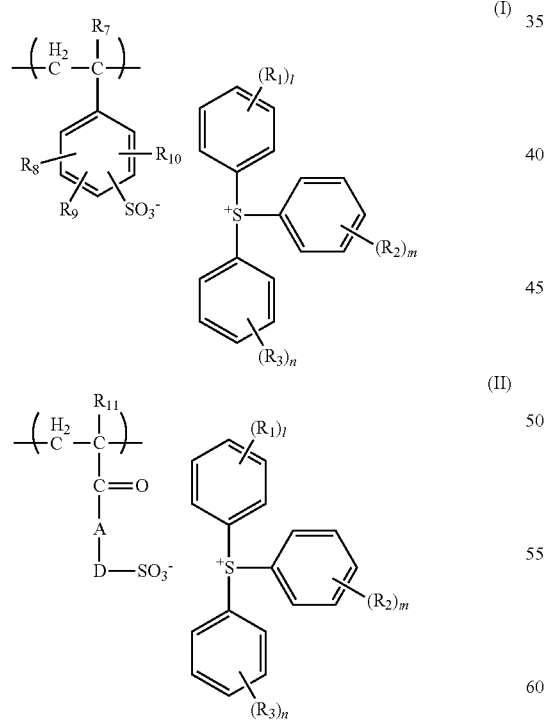

wherein each of $R_1$ to $R_3$ independently represents a hydroxyl group, a halogen atom, a substituted or unsubstituted alkyl group, a substituted or unsubstituted cycloalkyl group, a substituted or unsubstituted alkoxy group, —S—R$_6$, or a group having two or more heteroatoms, wherein $R_6$ represents a substituted or unsubstituted alkyl group, or a substituted or unsubstituted aryl group, at least one $R_1$ represents the group having two or more heteroatoms, the group having two or more heteroatoms represented by the at least one $R_1$ includes a heteroatomic group represented by —OSO$_2$—, —SO$_2$—, —CONH—, or —SO$_2$N(Ry)-, wherein Ry represents a hydrogen atom, a substituted or unsubstituted alkyl group, a substituted or unsubstituted cycloalkyl group, a substituted or unsubstituted alkoxy group, or a substituted or unsubstituted aryl group, and the heteroatomic group is directly bonded to the benzene ring bonded to S$^+$, l is an integer from 1 to 5, each of m and n is independently an integer from 0 to 5, each of $R_7$ and $R_{11}$ independently represents a hydrogen atom, a halogen atom, a cyano group, or a substituted or unsubstituted alkyl group, each of $R_8$ to $R_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group, A represents —O— or —NR$_{12}$—, wherein R$_{12}$ represents a hydrogen atom, a substituted or unsubstituted alkyl group, or a substituted or unsubstituted aryl group, and D represents a substituted or unsubstituted methylene group, a substituted or unsubstituted alkylene group, or a substituted or unsubstituted arylene group.

13. A production method of a radiation-sensitive resin composition, comprising:

mixing a polymer and a solvent, the polymer comprising a following repeating unit represented by a general formula (I), a following repeating unit represented by a general formula (II), or both thereof,

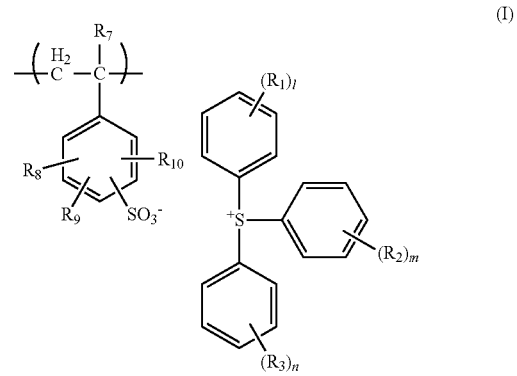

-continued

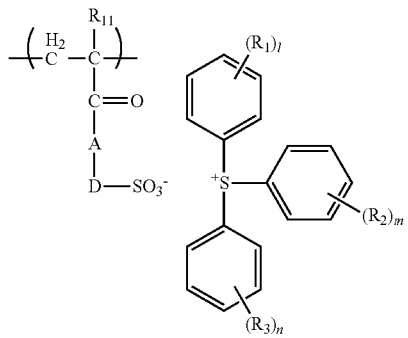

(II)

wherein
each of $R_1$ to $R_3$ independently represents a hydroxyl group, a halogen atom, a substituted or unsubstituted alkyl group, a substituted or unsubstituted cycloalkyl group, a substituted or unsubstituted alkoxy group, —S—$R_6$, or a group having two or more heteroatoms, wherein
$R_6$ represents a substituted or unsubstituted alkyl group, or a substituted or unsubstituted aryl group,
at least one $R_1$ represents the group having two or more heteroatoms,
the group having two or more heteroatoms represented by the at least one $R_1$ includes a heteroatomic group represented by —$OSO_2$—, —$SO_2$—, —CONH—, or —$SO_2$N(Ry)-, wherein Ry represents a hydrogen atom, a substituted or unsubstituted alkyl group, a substituted or unsubstituted cycloalkyl group, a substituted or unsubstituted alkoxy group, or a substituted or unsubstituted aryl group, and
the heteroatomic group is directly bonded to the benzene ring bonded to $S^+$,
l is an integer from 1 to 5,
each of m and n is independently an integer from 0 to 5,
each of $R_7$ and $R_{11}$ independently represents a hydrogen atom, a halogen atom, a cyano group, or a substituted or unsubstituted alkyl group,
each of $R_8$ to $R_{10}$ independently represents a hydrogen atom, a hydroxyl group, a halogen atom, a nitro group, a carboxyl group, a substituted or unsubstituted alkyl group, a substituted or unsubstituted aralkyl group, or a substituted or unsubstituted alkoxy group,
A represents —O— or —$NR_{12}$—, wherein $R_{12}$ represents a hydrogen atom, a substituted or unsubstituted alkyl group, or a substituted or unsubstituted aryl group, and
D represents a substituted or unsubstituted methylene group, a substituted or unsubstituted alkylene group, or a substituted or unsubstituted arylene group.

* * * * *